(12) United States Patent
Kosaka et al.

(10) Patent No.: US 12,431,455 B2
(45) Date of Patent: Sep. 30, 2025

(54) SEMICONDUCTOR DEVICE

(71) Applicant: ROHM CO., LTD., Kyoto (JP)

(72) Inventors: Takara Kosaka, Kyoto (JP); Kazuo Egami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 525 days.

(21) Appl. No.: 17/819,352

(22) Filed: Aug. 12, 2022

(65) Prior Publication Data

US 2023/0056682 A1   Feb. 23, 2023

(30) Foreign Application Priority Data

Aug. 23, 2021   (JP) .................................. 2021-135767

(51) Int. Cl.
*H01L 23/00* (2006.01)
*H01L 23/31* (2006.01)

(52) U.S. Cl.
CPC .......... *H01L 24/29* (2013.01); *H01L 23/3142* (2013.01); *H01L 24/42* (2013.01); *H01L 2224/29111* (2013.01); *H01L 2224/29139* (2013.01); *H01L 2924/01047* (2013.01); *H01L 2924/0105* (2013.01)

(58) Field of Classification Search
CPC ......... H01L 24/92; H01L 24/32; H01L 24/83; H01L 23/49551; H01L 24/05; H01L 24/45; H01L 24/73; H01L 2224/04026; H01L 24/29; H01L 23/3142; H01L 24/42; H01L 2224/29111; H01L 2224/29139;
(Continued)

(56) References Cited

U.S. PATENT DOCUMENTS

| | | | | |
|---|---|---|---|---|
| 2006/0147742 A1* | 7/2006 | Matsuda | .................. | H05K 1/09 428/673 |
| 2012/0118552 A1* | 5/2012 | White | ...................... | H01B 7/42 165/185 |
| 2012/0205790 A1* | 8/2012 | Haga | .................... | H01L 21/4842 257/676 |
| 2013/0171469 A1* | 7/2013 | Teng | ..................... | H10F 77/244 428/629 |

(Continued)

FOREIGN PATENT DOCUMENTS

| | | | |
|---|---|---|---|
| JP | 2009277949 A | 11/2009 | |
| JP | 2009290007 | * 12/2009 | ............. H01L 24/83 |

(Continued)

OTHER PUBLICATIONS

Office Action issued in U.S. Appl. No. 17/819,516, dated Apr. 9, 2025.

(Continued)

*Primary Examiner* — Galina G Yushina
(74) *Attorney, Agent, or Firm* — HSML P. C.

(57) ABSTRACT

A semiconductor device includes: a semiconductor element; a support member; a bonding layer interposed between the semiconductor element and the support member; and a sealing resin that covers the semiconductor element and at least a portion of the support member, wherein the bonding layer is a layer in which a layer containing first metal and a layer containing second metal are integrated without going through a molten state, and wherein the support member includes a first surface facing in a thickness direction and facing a side on which the semiconductor element is located, and a plurality of first recesses located outside the bonding layer and recessed from the first surface when viewed along the thickness direction.

11 Claims, 23 Drawing Sheets

(58) Field of Classification Search
CPC ... H01L 2924/01047; H01L 2924/0105; H01L 24/48
See application file for complete search history.

(56) References Cited

U.S. PATENT DOCUMENTS

| | | | | |
|---|---|---|---|---|
| 2015/0380374 | A1* | 12/2015 | Nakamura | H01L 24/01 361/783 |
| 2017/0133341 | A1 | 5/2017 | Seddon et al. | |
| 2023/0056682 | A1 | 2/2023 | Kosaka et al. | |

FOREIGN PATENT DOCUMENTS

| | | | | |
|---|---|---|---|---|
| JP | 2009290007 | A | 12/2009 | |
| JP | 2012174926 | A | 9/2012 | |
| JP | 2013157483 | A | 8/2013 | |
| JP | 2014179648 | A | 9/2014 | |
| JP | 2016058612 | A | 4/2016 | |
| JP | 2017055044 | A | 3/2017 | |
| JP | 2020-088319 | A | 6/2020 | |
| JP | 2021048349 | A | 3/2021 | |
| WO | WO 2005/002773 | * | 1/2005 | B23K 1/20 |
| WO | 2015004956 | A1 | 1/2015 | |

OTHER PUBLICATIONS

Notice of Reasons for Refusal issued in Japanese Patent Application No. 2021-135767, dated May 19, 2025, with English translation.
Notice of Reasons for Refusal issued in Japanese Patent Application No. 2021-135784, dated May 19, 2025, with English translation.

* cited by examiner

SEMICONDUCTOR DEVICE

CROSS-REFERENCE TO RELATED APPLICATION

This application is based upon and claims the benefit of priority from Japanese Patent Application No. 2021-135767, filed on Aug. 23, 2021, the entire contents of which are incorporated herein by reference.

TECHNICAL FIELD

The present disclosure relates to a semiconductor device.

BACKGROUND

A semiconductor device including a lead, a semiconductor element, and solder for bonding the lead and the semiconductor element is disclosed in the related art.

When there is a temperature change during mounting or use of the semiconductor device, a thermal stress is generated mainly due to a difference in the coefficient of thermal expansion between the lead and the semiconductor element. This thermal stress tends to increase as the thickness of a bonding layer such as the solder becomes thinner. This thermal stress may cause problems such as cracks and peeling in bonding between the lead and the semiconductor element.

SUMMARY

Some embodiments of the present disclosure provide a semiconductor device capable of suppressing defects in bonding between a lead and a semiconductor element.

A semiconductor device provided according to one embodiment of the present disclosure includes: a semiconductor element; a support member; a bonding layer interposed between the semiconductor element and the support member; and a sealing resin that covers the semiconductor element and at least a portion of the support member, wherein the bonding layer is a layer in which a layer containing first metal and a layer containing second metal are integrated without going through a molten state, and wherein the support member includes a first surface facing in a thickness direction and facing a side on which the semiconductor element is located, and a plurality of first recesses located outside the bonding layer and recessed from the first surface when viewed along the thickness direction.

Other features and advantages of the present disclosure will become more apparent with the detailed description given below with reference to the accompanying drawings.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
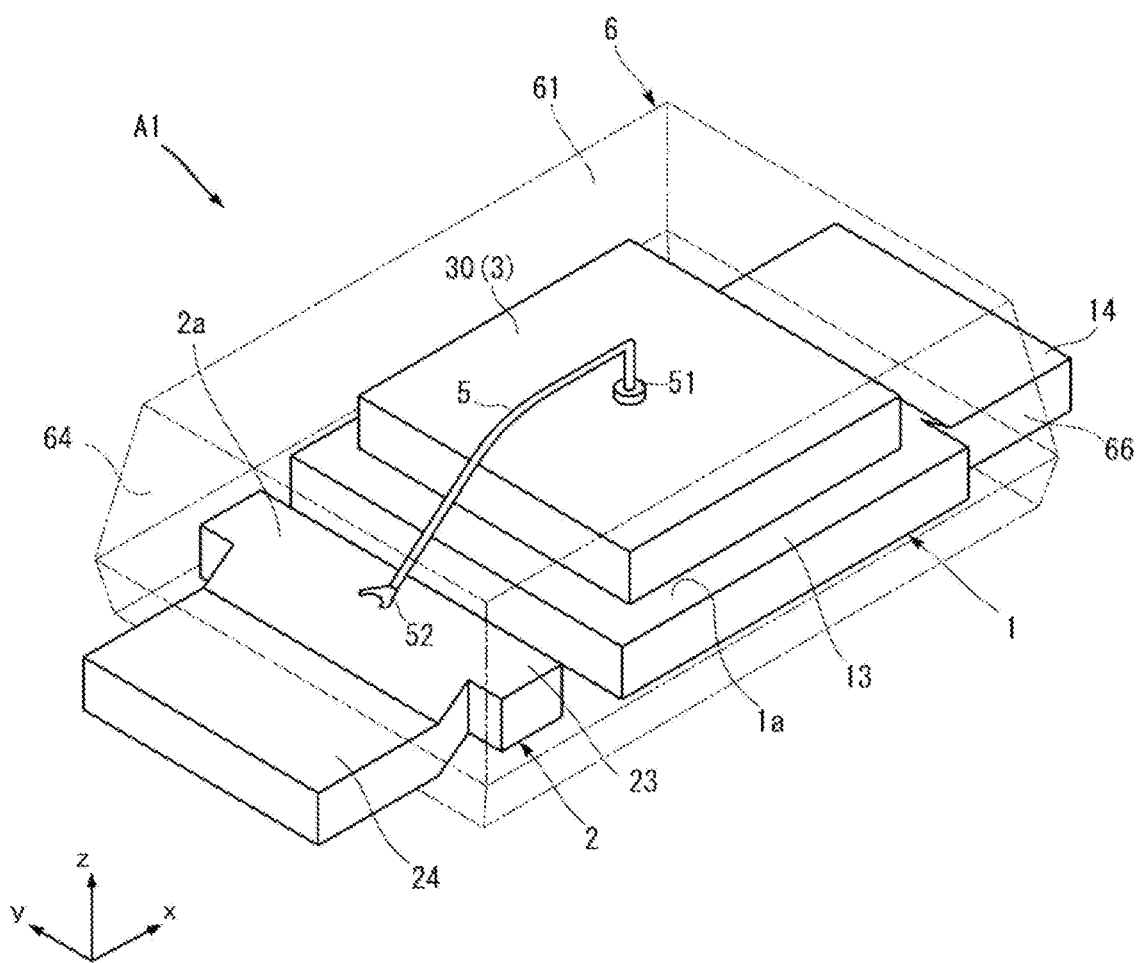
FIG. 1 is a perspective view showing a semiconductor device according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Preferred embodiments of the present disclosure will be now described in detail with reference to the drawings.

In the present disclosure, the terms "first," "second," "third," etc. are used merely for the purpose of identification, and are not necessarily intended to order their objects.

First Embodiment

FIGS. 1 to 9 show a semiconductor device according to a first embodiment of the present disclosure. The semiconductor device A1 of the present embodiment includes a support member 1, a conduction member 2, a semiconductor element 3, a bonding layer 4, a wire 5, and a sealing resin 6.

Figure 2:
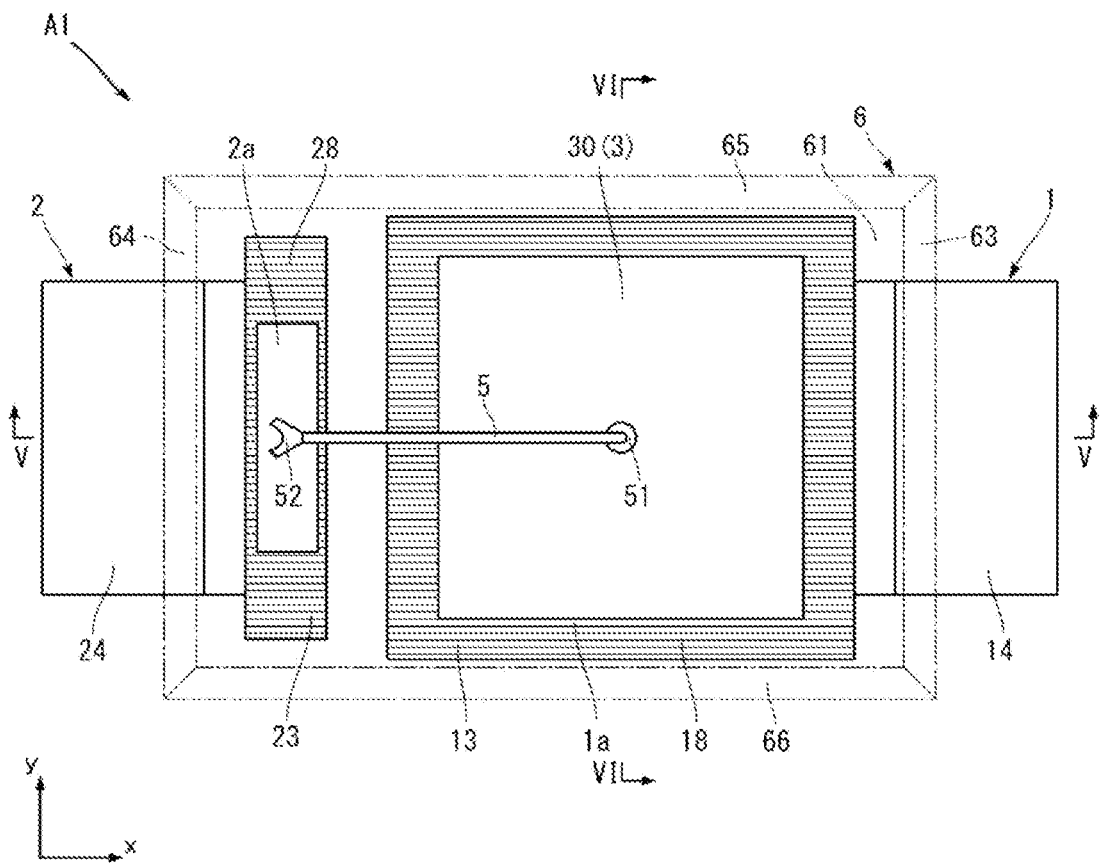
FIG. 2 is a plan view showing the semiconductor device according to the first embodiment of the present disclosure.
Figure 3:
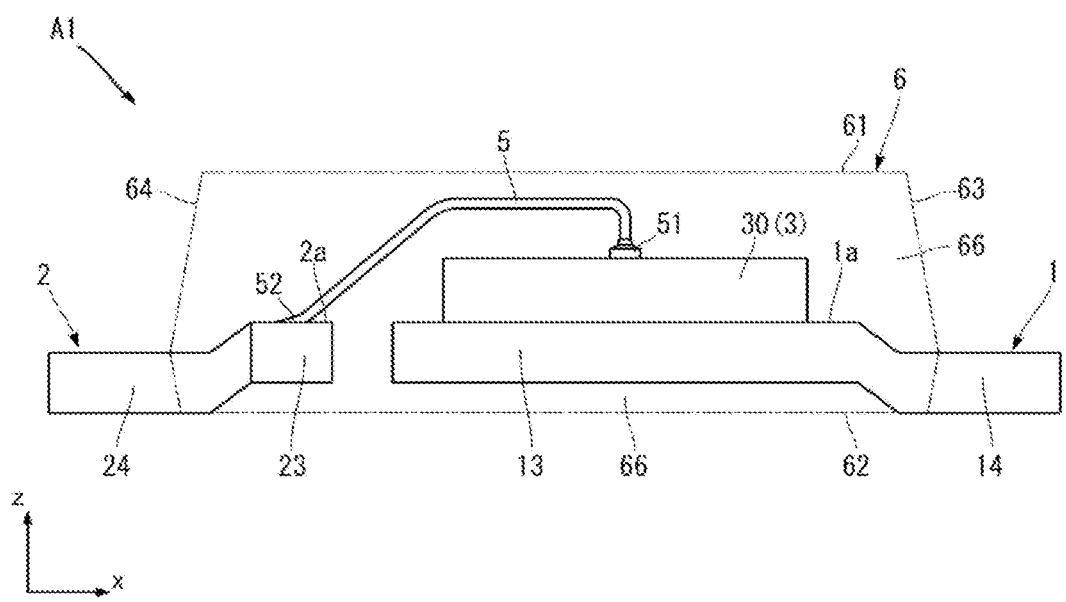
FIG. 3 is a front view showing the semiconductor device according to the first embodiment of the present disclosure.
Figure 4:
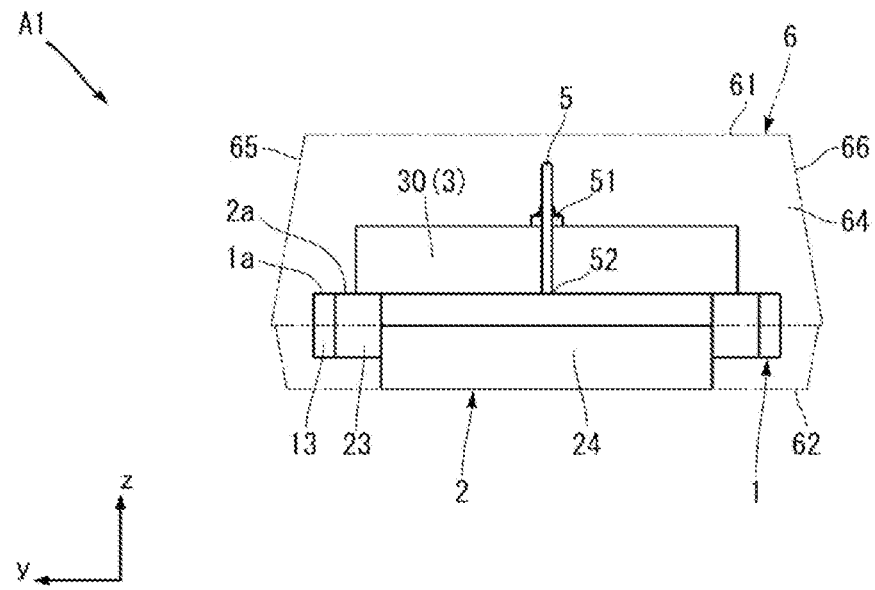
FIG. 4 is a side view showing the semiconductor device according to the first embodiment of the present disclosure.
Figure 5:
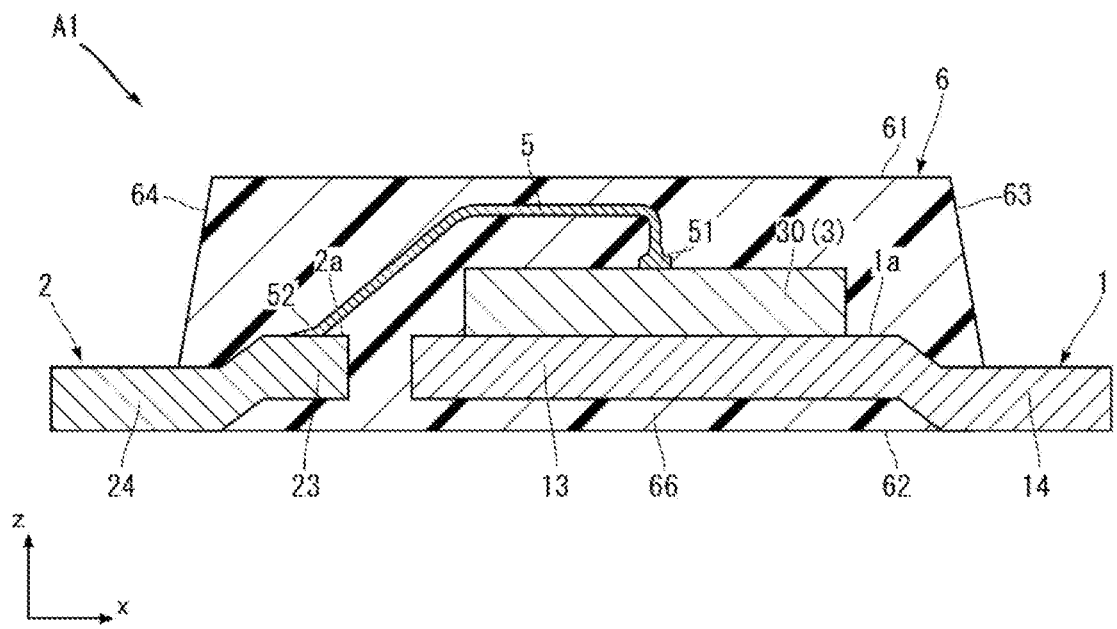
FIG. 5 is a cross-sectional view taken along line V-V of FIG. 2.
Figure 6:
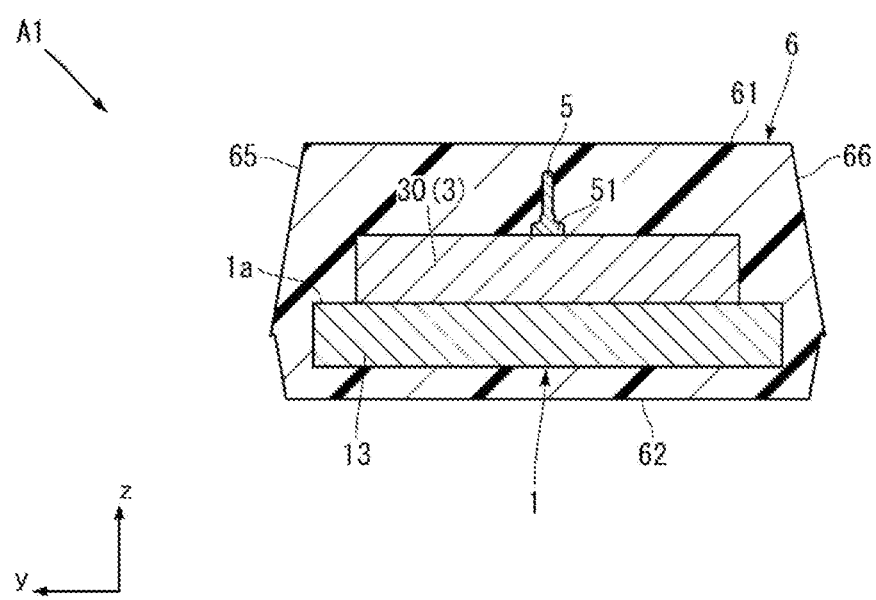
FIG. 6 is a cross-sectional view taken along VI-VI line of FIG. 2.
Figure 7:
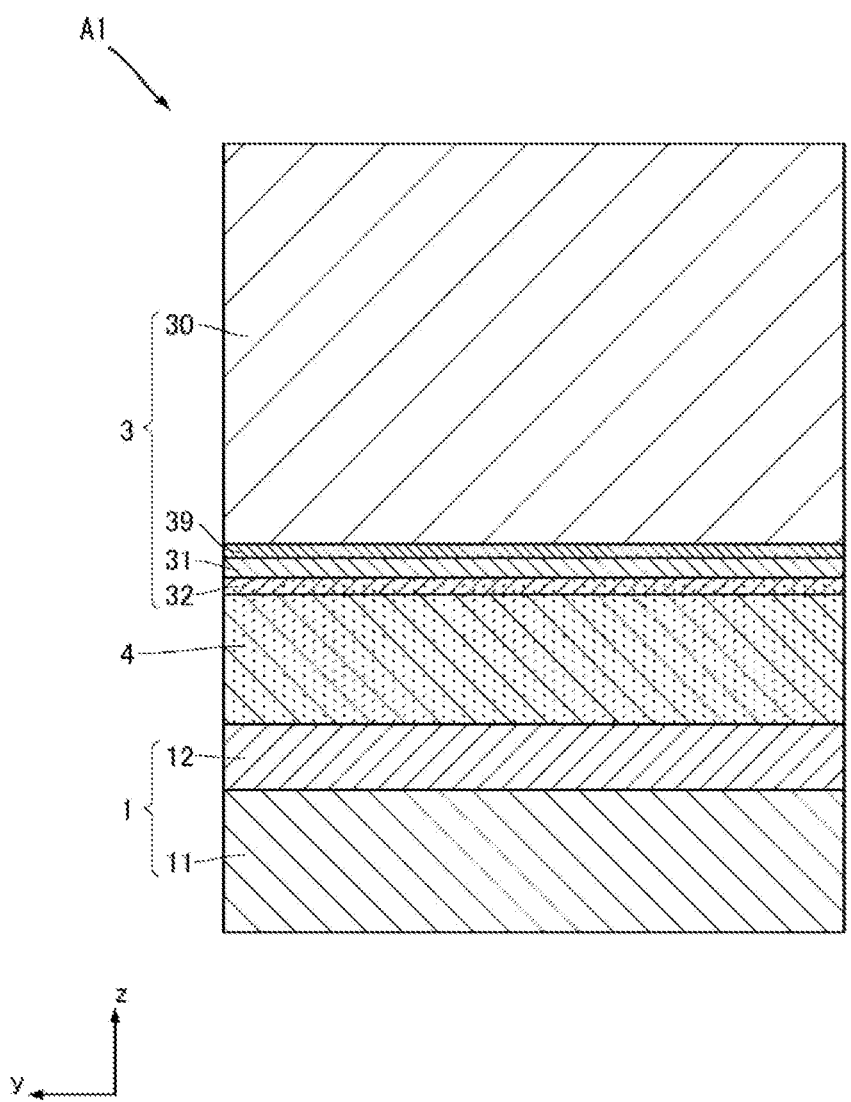
FIG. 7 is an enlarged cross-sectional view of a main part showing the semiconductor device according to the first embodiment of the present disclosure.
Figure 8:
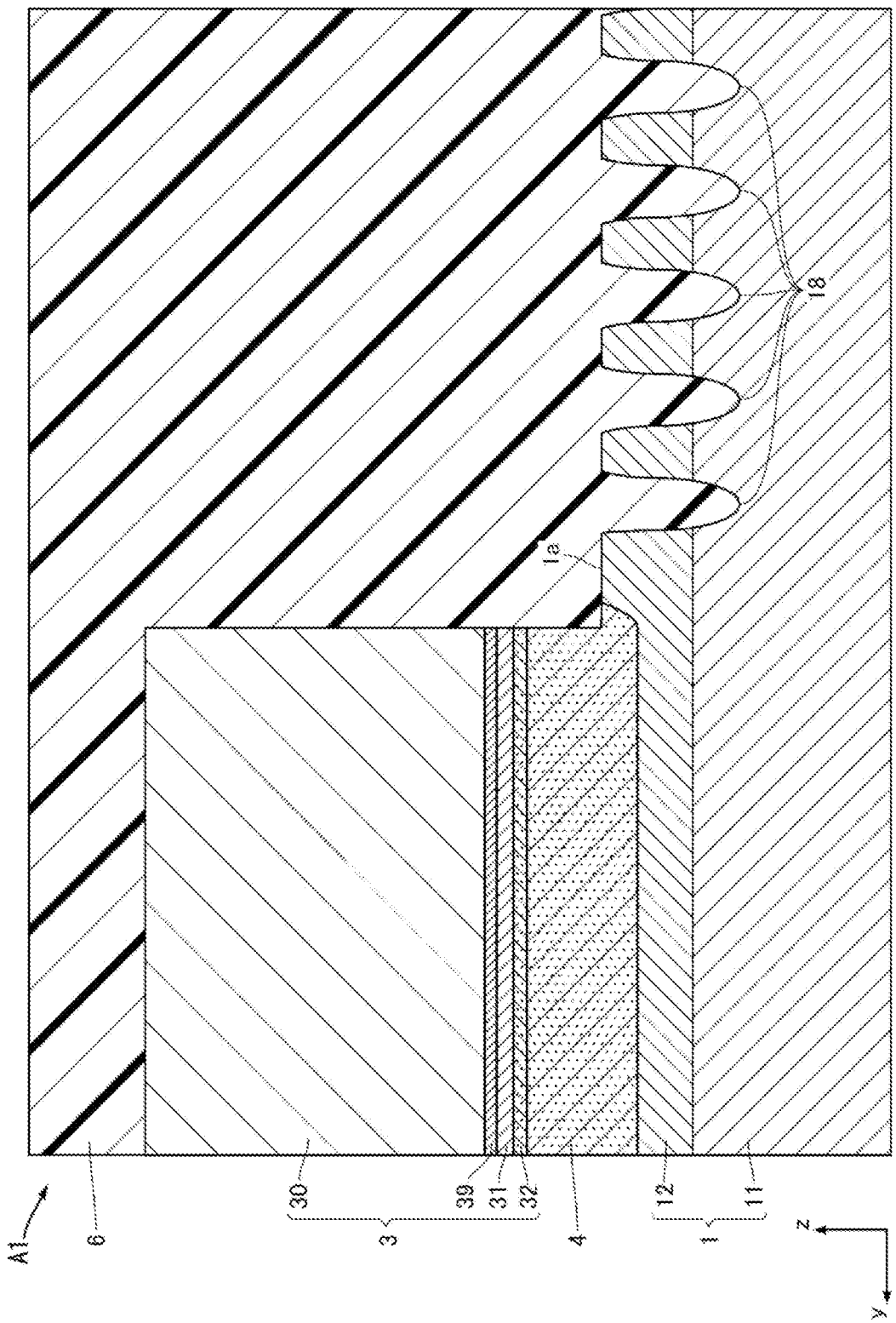
FIG. 8 is an enlarged cross-sectional view of the main part taken along VI-VI line of FIG. 2.
Figure 9:
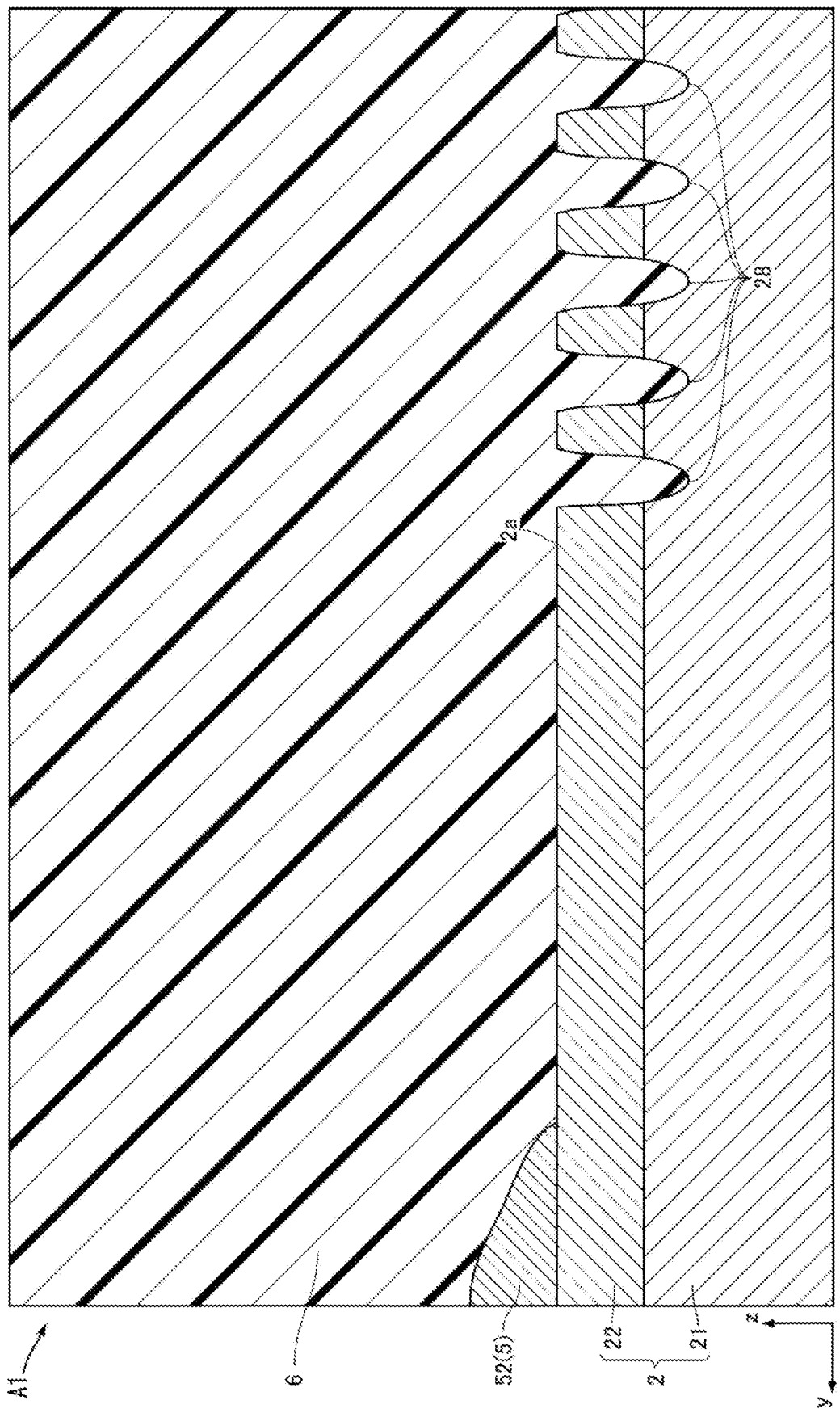
FIG. 9 is an enlarged cross-sectional view of the main part taken along VI-VI line of FIG. 2.

FIG. 1 is a perspective view showing the semiconductor device A1. FIG. 2 is a plan view showing the semiconductor device A1. FIG. 3 is a front view showing the semiconductor device A1. FIG. 4 is a side view showing the semiconductor device A1. FIG. 5 is a cross-sectional view taken along line V-V of FIG. 2. FIG. 6 is a cross-sectional view taken along line VI-VI of FIG. 2. FIG. 7 is an enlarged cross-sectional view of a main part showing the semiconductor device A1. FIG. 8 is an enlarged cross-sectional view of the main part taken along VI-VI line of FIG. 2. FIG. 9 is an enlarged cross-sectional view of the main part taken along VI-VI line of FIG. 2. In these figures, a z direction is a thickness direction in the present disclosure. Both an x direction and a y direction are orthogonal to the z direction and are orthogonal to each other. In FIGS. 1 to 4, the sealing resin 6 is indicated by an imaginary line. In FIGS. 1 to 6, the bonding layer 4 is omitted for the convenience of understanding. FIG. 7 is an enlarged cross-sectional view of the main part in the vicinity of the center of the semiconductor element 3 when viewed along the z direction.

[Support Member 1]

The support member 1 is a member that supports the semiconductor element 3. The specific configuration of the support member 1 is not limited in any way. As shown in FIGS. 1 to 6, the support member 1 of the present embodiment includes a die bonding portion 13 and an extension portion 14.

The die bonding portion 13 is a portion that supports the semiconductor element 3. The shape of the die bonding portion 13 is not particularly limited and is rectangular in the depicted example.

The extension portion 14 is a portion extending from the die bonding portion 13 to one side in the x direction. The shape of the extension portion 14 is not particularly limited. In the illustrated example, the extension portion 14 is a band shape extending in the x direction when viewed along the z direction. Further, the extension portion 14 includes a bent portion as shown in FIGS. 1, 3, and 5.

In the present embodiment, as shown in FIGS. 7 and 8, the support member 1 includes a base material 11 and a surface layer 12. The base material 11 is a portion forming a main body of the support member 1. The base material 11 contains, for example, metal such as Cu, Fe, or Ni, or an alloy thereof. In the following description, a case where the base material 11 contains Cu will be described as an example. The thickness of the base material 11 is not particularly limited and is, for example, 100 mm or more and 400 mm or less.

The surface layer 12 is a layer formed on the base material 11 and contains second metal. Examples of the second metal of the present disclosure include Ag, Au, Cu, Pt, Pd, Ni, Co, Fe, Mn, V, Ti, Ce, Dy, Y, Yb, Hf, Mg, and Sn. In the present embodiment, metal capable of forming an alloy with the first metal, which will be described later, is selected as the second metal. In the following description, a case where the second metal is Ag will be described as an example. The thickness of the surface layer 12 is, for example, 2 µm or more and 5 µm or less and is set to, for example, about 3 µm. A method of forming the surface layer 12 is not limited in any way. For example, the surface layer 12 is formed by plating. In the present embodiment, the surface layer 12 is formed on the die bonding portion 13. The surface layer 12 constitutes a first surface 1a of the die bonding portion 13. The first surface 1a is a surface facing one side in the z direction.

As shown in FIGS. 2 and 8, the support member 1 of the present embodiment includes a plurality of first recesses 18. In FIG. 2, the plurality of first recesses 18 are indicated by a plurality of straight lines extending in the x direction. The plurality of first recesses 18 are recessed from the first surface 1a. The plurality of first recesses 18 are formed at positions avoiding the semiconductor element 3 and the bonding layer 4 when viewed along the z direction. Further, in the depicted example, the plurality of first recesses 18 are formed in an annular region surrounding the semiconductor element 3 when viewed along the z direction. The plurality of first recesses 18 are buried with the sealing resin 6.

A method of forming the plurality of first recesses 18 is not limited in any way, and examples thereof may include laser processing, etching processing, stamping processing, and the like. In the example shown, the plurality of first recesses 18, each of which extends along the x direction, are formed by laser processing.

As shown in FIG. 8, each of the first recesses 18 of the present embodiment penetrates the surface layer 12 and reaches the base material 11. In this case, the depth of the first recess 18 is equal to or greater than the thickness of the surface layer 12. The depth of the first recess 18 is, for example, 3 µm or more and 5 µm or less.

[Conduction Member 2]

The conduction member 2 is a member that constitutes a conduction path between the semiconductor element 3 and the outside. The specific configuration of the conduction member 2 is not limited in any way. The conduction member 2 is separated from the support member 1. In the present embodiment, the conduction member 2 is separated from the support member 1 in the x direction. As shown in FIGS. 1 to 6, the conduction member 2 of the present embodiment includes a wire bonding portion 23 and an extension portion 24.

The wire bonding portion 23 is a portion to which the wire 5 is bonded. The shape of the wire bonding portion 23 is not particularly limited. In the example shown, the wire bonding portion 23 has a rectangular shape with the y direction as a longitudinal direction.

The extension portion 24 is a portion extending from the wire bonding portion 23 to the other side in the x direction. The shape of the extension portion 24 is not particularly limited. In the depicted example, the extension portion 24 has a band shape extending in the x direction when viewed along the z direction. Further, the extension portion 24 includes a bent portion as shown in FIGS. 1, 3 and 5.

In the present embodiment, as shown in FIG. 9, the conduction member 2 includes a base material 21 and a surface layer 22. The base material 21 is a portion forming the main body of the conduction member 2. The base material 21 contains, for example, metal such as Cu, Fe, or Ni, or an alloy thereof. In the following description, a case where the base material 21 contains Cu will be described as an example. The thickness of the base material 21 is not particularly limited and is, for example, 100 mm or more and 400 mm or less.

The surface layer 22 is a layer formed on the base material 21. Metal contained in the surface layer 22 is not limited in any way. In the present embodiment, the surface layer 22 contains the same Ag as the second metal contained in the surface layer 12. The surface layer 22 may be configured to contain metal different from the metal contained in the surface layer 12. The thickness of the surface layer 22 is, for example, 2 µm or more and 5 µm or less and is set to, for example, about 3 µm. A method of forming the surface layer 22 is not limited in any way. For example, the surface layer 22 is formed by plating. In the present embodiment, the surface layer 22 is formed on the wire bonding portion 23. The surface layer 22 constitutes a second surface 2a of the wire bonding portion 23. The second surface 2a is a surface facing one side in the z direction.

As shown in FIGS. 2 and 9, the conduction member 2 of the present embodiment includes a plurality of second recesses 28. In FIG. 2, the plurality of second recesses 28 are indicated by a plurality of straight lines extending in the x direction. The plurality of second recesses 28 are recessed from the second surface 2a. The plurality of second recesses 28 are formed at positions avoiding the second bonding portion 52, which will be described later, of the wire 5 when viewed along the z direction. Further, in the depicted example, the plurality of second recesses 28 are formed in an annular region surrounding the second bonding portion 52 when viewed along the z direction. The plurality of second recesses 28 are buried with the sealing resin 6.

A method of forming the plurality of second recesses 28 is not limited in any way, and examples thereof may include laser processing, etching processing, stamping processing, and the like. In the example shown, the plurality of second recesses 28, each of which extends along the x direction, are formed by laser processing.

As shown in FIG. 9, each of the second recesses 28 of the present embodiment penetrates the surface layer 22 and reaches the base material 21. In this case, the depth of the second recess 28 is equal to or greater than the thickness of the surface layer 22. The depth of the first recess 18 is, for example, 3 µm or more and 5 µm or less.

[Semiconductor Element 3]

The semiconductor element 3 functions to form a portion of an electric circuit when the semiconductor device A1 is incorporated in the electric circuit. The specific configuration of the semiconductor element 3 is not limited in any way. Examples of the semiconductor element 3 may include a diode, a transistor, and the like. In this embodiment, a diode is selected as the semiconductor element 3.

The semiconductor element 3 is supported by the die bonding portion 13 of the support member 1. The surface layer 12 is formed in a portion of the die bonding portion 13 that supports the semiconductor element 3, and a plurality of first recesses 18 are not formed in the portion of the die bonding portion 13.

As shown in FIGS. 7 and 8, the semiconductor element 3 includes a semiconductor layer 30. The semiconductor layer 30 includes a semiconductor such as Si, SiC, or GaN. An electrode (not shown) is formed on the semiconductor layer 30, and the wire 5 is bonded to the electrode.

Further, in the present embodiment, the semiconductor element 3 includes a first layer 31, a second layer 32, and a base layer 39.

The first layer 31 is interposed between the semiconductor layer 30 and the bonding layer 4. The first layer 31 contains third metal. Examples of the third metal may include Ag, Au, Cu, Pt, Pd, Ni, Co, Fe, Mn, V, Ti, Ce, Dy, Y, Yb, Hf, and Mg. In the present embodiment, metal capable of forming an alloy with the first metal, which will be described later, is selected as the third metal. In the following description, a case where the third metal is Ni will be described as an example. The thickness of the first layer 31 is, for example, 0.1 µm or more and 0.5 µm or less and is set to, for example, about 0.3 µm.

The second layer 32 is interposed between the first layer 31 and the bonding layer 4. The second layer 32 contains an alloy of the first metal and the third metal. Examples of the first metal may include Ag, Au, Cu, Pt, Pd, Ni, Co, Fe, Mn, V, Ti, Ce, Dy, Y, Yb, Hf, Mg, and Sn. In the present embodiment, metal capable of forming an alloy with the second metal and the third metal is selected as the first metal. In the following description, a case where the first metal is Sn will be described as an example. That is, the second layer 32 of the present embodiment contains a Sn—Ni alloy which is an alloy of Sn and Ni. The thickness of the second layer 32 is, for example, 0.1 µm or more and 0.5 µm or less.

The base layer 39 is interposed between the semiconductor layer 30 and the first layer 31 and is in direct contact with the semiconductor layer 30. The base layer 39 contains, for example, Ti. The thickness of the base layer 39 is, for example, 0.05 µm or more and 0.2 µm or less and is set to, for example, about 0.1 µm.

[Bonding Layer 4]

As shown in FIGS. 7 and 8, the bonding layer 4 is interposed between the semiconductor element 3 and the support member 1. The bonding layer 4 functions to bond the semiconductor element 3 and the support member 1. The bonding layer 4 contains an alloy of the first metal and the second metal. Examples of the alloy of the first metal and the second metal may include $Ag_3Sn$, $PtSn_4$, $PtSn_2$, $Pt_2Sn_3$, $PdSn_4$, $PdSn_3$, $PdSn_2$, $Ni_3Sn_4$, $CoSn_2$, $FeSn_2$, $MnSn_2$, $V_2Sn_3$, $CeSn_3$, $DySn_4$, $Sn_3Y$, $Sn_3Yb$, and $Hf_5Sn_2$. As described above, Sn is selected as the first metal and Ag is selected as the second metal. In this case, the bonding layer 4 contains $Ag_3Sn$ which is an alloy of Sn as the first metal and Ag as the second metal. The bonding layer 4 has a composition ratio of Ag of 73 mass % or more. The thickness of the bonding layer 4 is not particularly limited and is, for example, 2 µm or more and 5 µm or less, and is set to, for example, about 3 µm.

As can be understood from a method of manufacturing the semiconductor device A1, which will be described later, most of the bonding layer 4 overlaps with the semiconductor element 3 when viewed along the z direction. As shown in FIG. 8, depending on the conditions of the manufacturing method and the like, the bonding layer 4 may include a portion slightly protruding from the semiconductor element 3 in a direction (the x direction, the y direction, etc.) orthogonal to the z direction when viewed along the z direction. However, unlike the illustrated example, the bonding layer 4 may have a configuration that does not protrude from the semiconductor element 3 when viewed along the z direction.

Further, as shown in FIG. 8, depending on the conditions of the manufacturing method and the like, the bonding layer 4 may include a portion located on the base material 11 side in the z direction with respect to the first surface 1a. In this case, a portion of the bonding layer 4 takes a shape in which it is inserted into the surface layer 12. However, the bonding layer 4 may have a configuration in which it is located on the side away from the base material 11 in the z direction with respect to the first surface 1a.

[Wire 5]

The wire 5 constitutes a conduction path between the semiconductor element 3 and the outside. In the present embodiment, the wire 5 conducts the semiconductor element 3 and the conduction member 2. The material of the wire 5 is not limited in any way and includes Au, Al, Cu, and the like.

The wire 5 includes a first bonding portion 51 and a second bonding portion 52. The first bonding portion 51 is a portion bonded to the above-mentioned electrode (not shown) of the semiconductor element 3. The second bonding portion 52 is a portion bonded to the second surface 2a of the wire bonding portion 23 of the conduction member 2.

[Sealing Resin 6]

The sealing resin 6 covers a portion of each of the support member 1 and the conduction member 2, the semiconductor element 3, the bonding layer 4, and the wire 5. The sealing resin 6 contains an insulating resin, for example, a black epoxy resin.

The shape of the sealing resin 6 is not limited in any way. As shown in FIGS. 1 to 6, in the illustrated example, the sealing resin 6 includes a first surface 61, a second surface 62, a third surface 63, a fourth surface 64, a fifth surface 65, and a sixth surface 66.

The first surface 61 is a surface facing one side in the z direction and is a flat surface in the depicted example. The second surface 62 is a surface facing the other side in the z direction and is a flat surface in the depicted example. The third surface 63 is a surface facing one side in the x direction and is a bent surface in the depicted example. The fourth surface 64 is a surface facing the other side in the x direction and is a bent surface in the depicted example. The fifth surface 65 is a surface facing one side in the y direction and is a bent surface in the depicted example. The sixth surface 66 is a surface facing the other side in the y direction and is a bent surface in the depicted example.

In the present embodiment, the extension portion 14 of the support member 1 protrudes from the third surface 63 of the sealing resin 6 to one side in the x direction. Further, the extension portion 24 of the conduction member 2 protrudes from the fourth surface 64 of the sealing resin 6 to the other side in the x direction.

In the present embodiment, the surface of the extension portion 14 facing the other side in the z direction is flush with the second surface 62. Further, the surface of the extension portion 24 facing the other side in the z direction is flush with the second surface 62.

Next, the method of manufacturing the semiconductor device A1 will be described below with reference to FIGS. 10 to 19.

Figure 10:
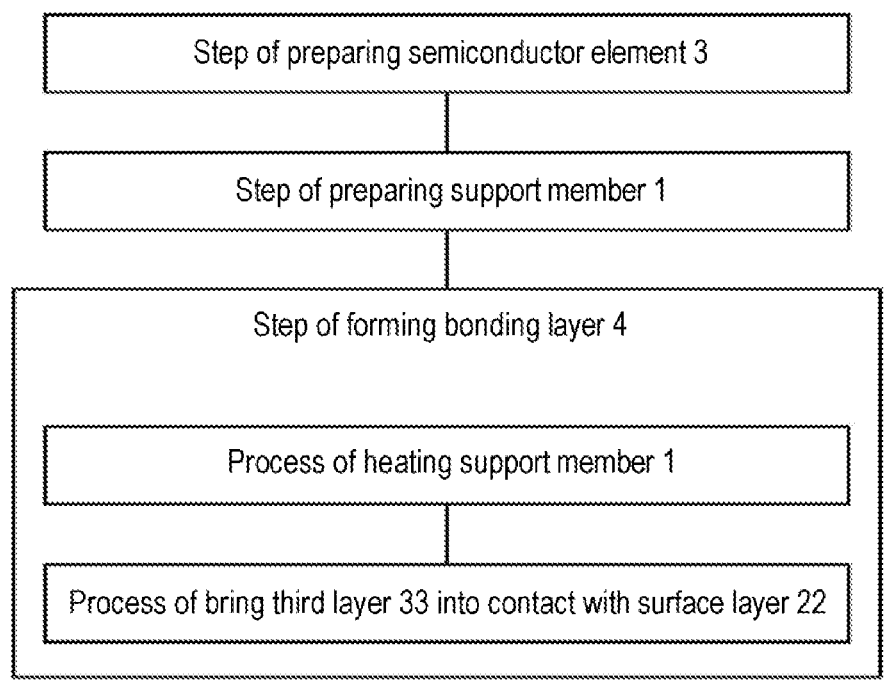
FIG. 10 is a flowchart showing a method of manufacturing the semiconductor device according to the first embodiment of the present disclosure.

FIG. 10 is a flowchart showing an example of the method of manufacturing the semiconductor device A1. The depicted manufacturing method includes a step of preparing the semiconductor element 3, a step of preparing the support member 1, and a step of forming the bonding layer 4.

Figure 11:
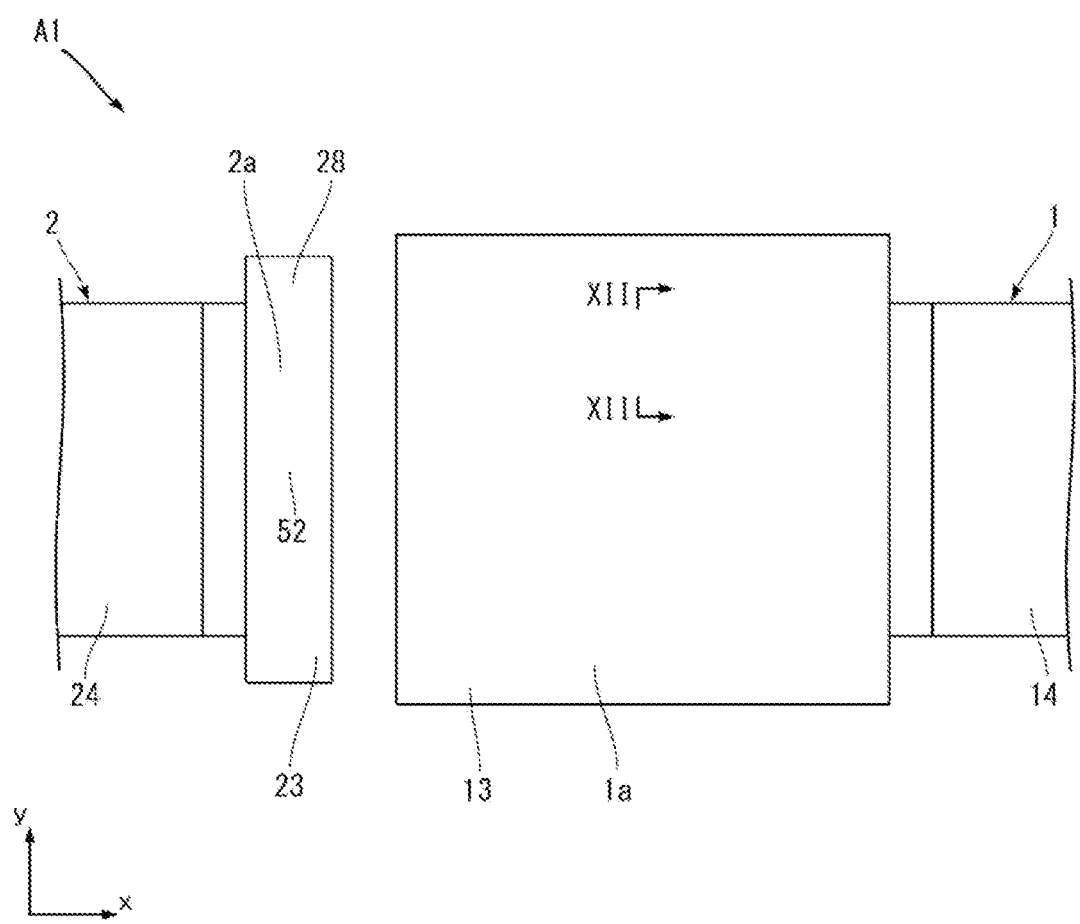
FIG. 11 is a plan view of the main part showing the method of manufacturing the semiconductor device according to the first embodiment of the present disclosure.
Figure 12:
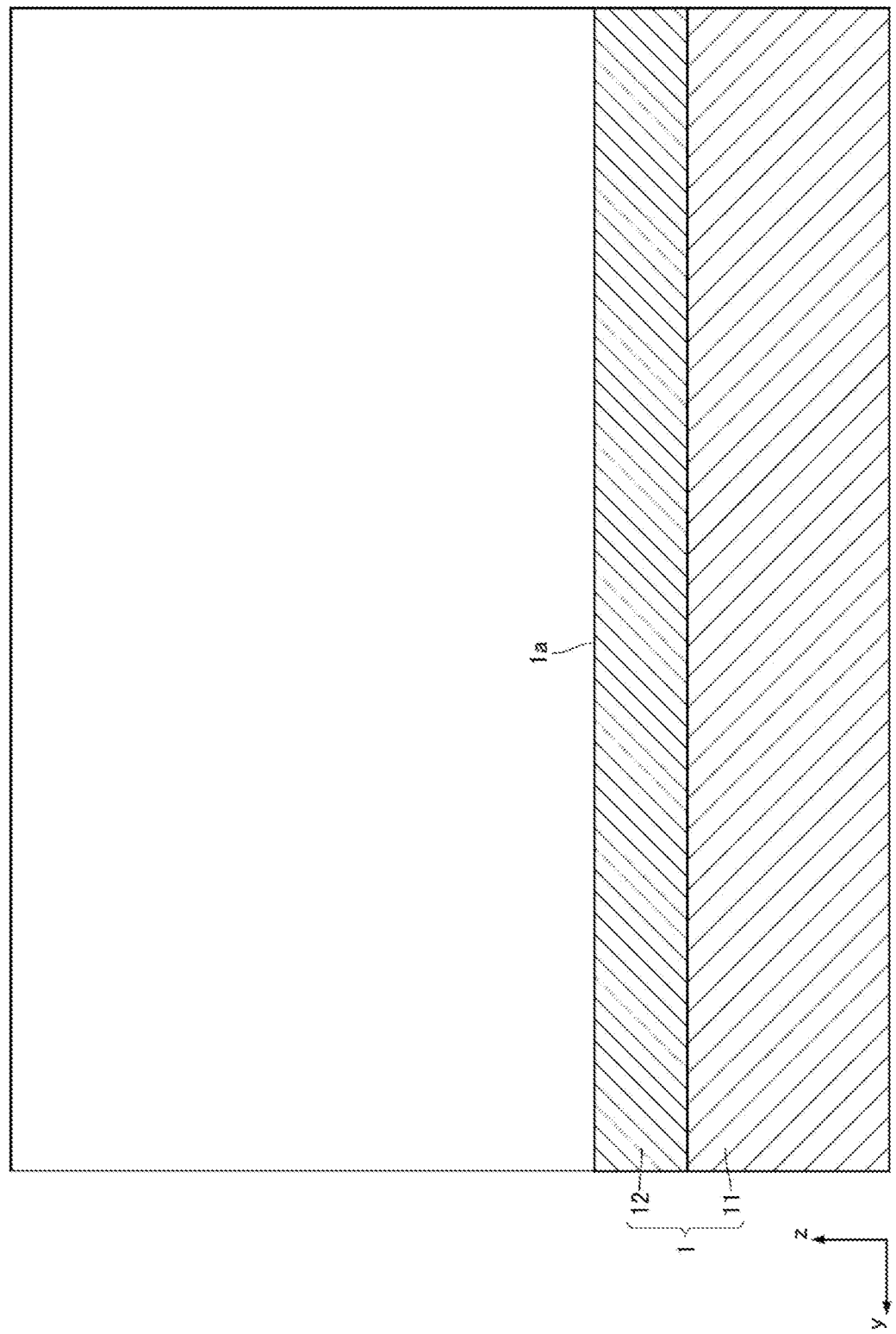
FIG. 12 is an enlarged cross-sectional view of the main part taken along line XII-XII of FIG. 11.

First, as shown in FIGS. 11 and 12, the support member 1 is prepared. The illustrated support member 1 is configured to be included in a portion of a lead frame together with the conduction member 2. This lead frame is for collectively manufacturing a plurality of semiconductor devices A1. The semiconductor device A1 may be manufactured individually.

The support member 1 shown in these figures includes the base material 11 and the surface layer 12, and includes the die bonding portion 13 and the extension portion 14. In this example, the base material 11 contains Cu. The surface layer 12 is a layer having substantially a uniform thickness which is formed on the base material 11 by plating or the like. The thickness of the surface layer 12 is, for example, 2 µm or more and 5 µm or less and is set to, for example, about 3 µm. In this example, the surface layer 12 contains Ag.

The conduction member 2 includes the base material 21 and the surface layer 22, and includes the wire bonding portion 23 and the extension portion 24. In this example, the base material 21 contains Cu. The surface layer 22 is a layer having substantially a uniform thickness, which is formed on the base material 21 by plating or the like. The thickness of the surface layer 22 is, for example, 2 µm or more and 5 µm or less and is set to, for example, about 3 µm. In this example, the surface layer 22 contains Ag.

Figure 13:
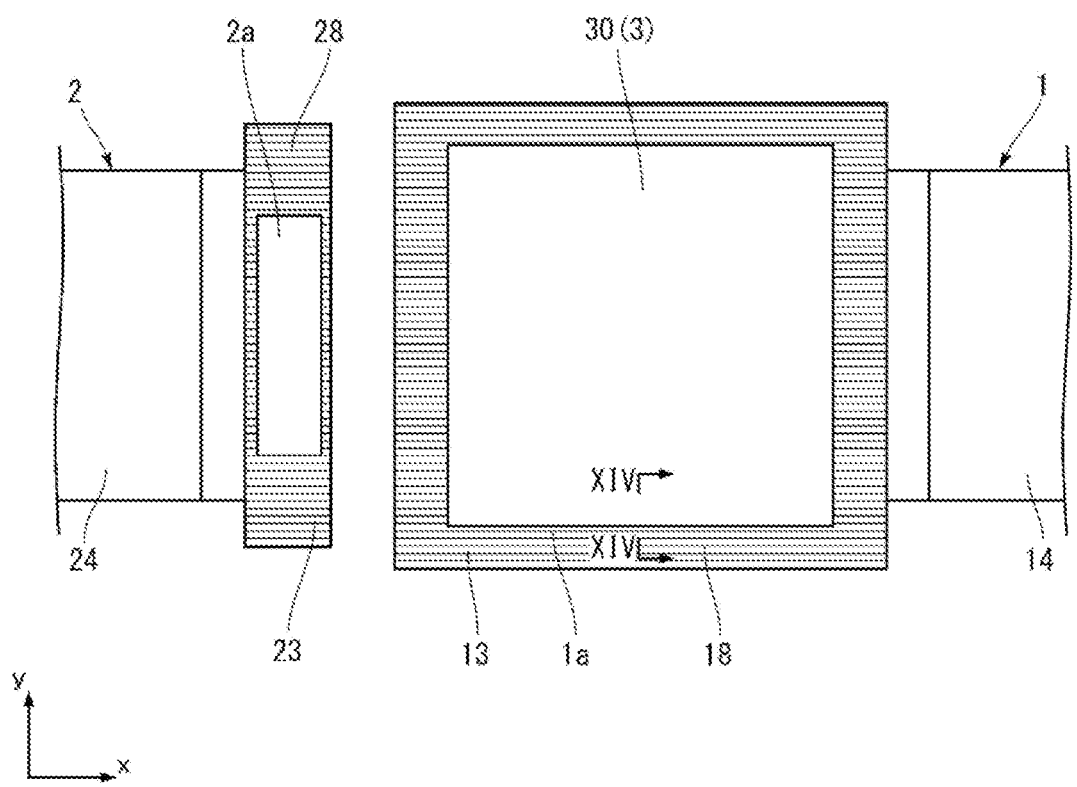
FIG. 13 is a plan view of the main part showing the method of manufacturing the semiconductor device according to the first embodiment of the present disclosure.
Figure 14:
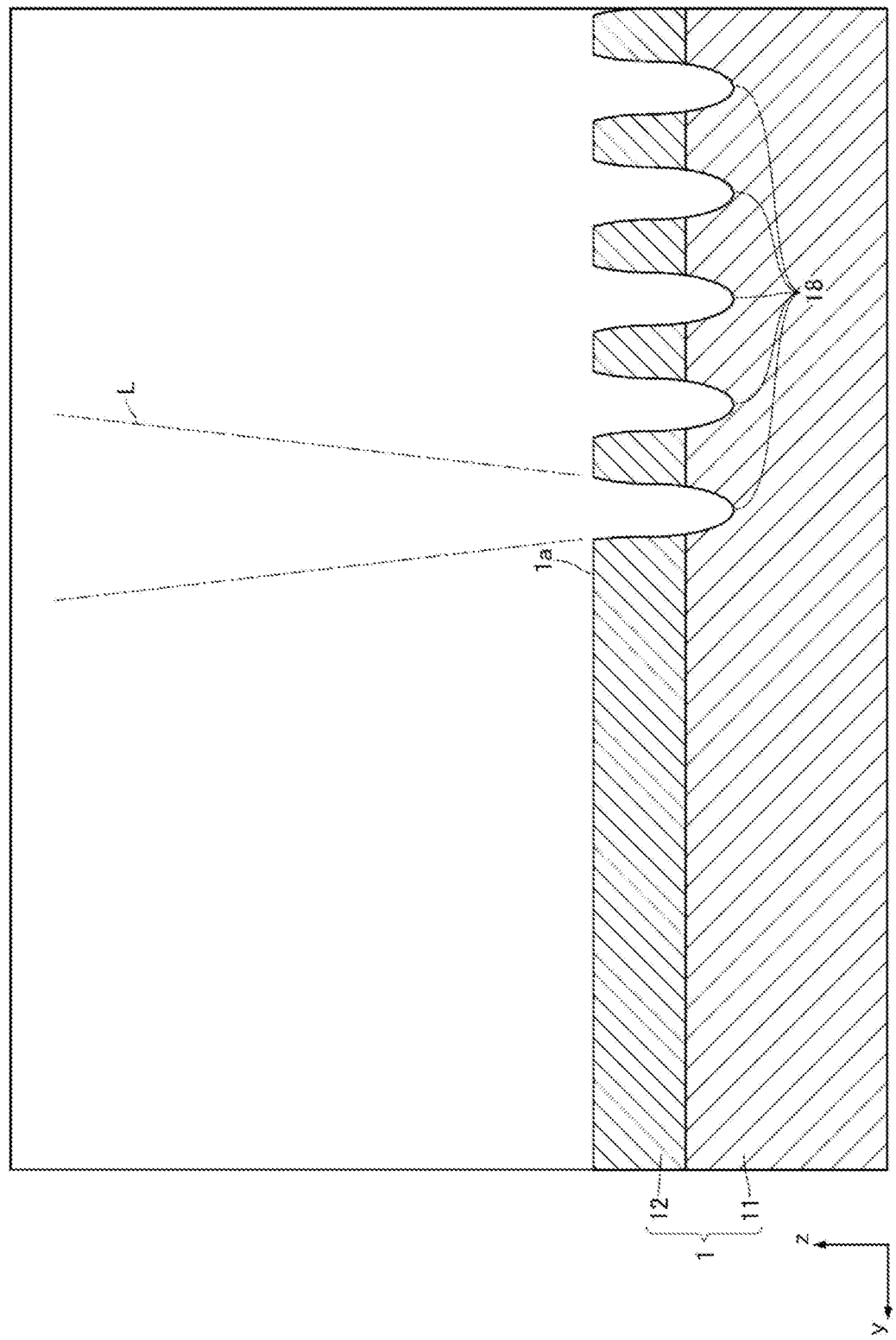
FIG. 14 is an enlarged cross-sectional view of the main part taken along XIV-XIV line of FIG. 13.

Next, as shown in FIGS. 13 and 14, the plurality of first recesses 18 are formed in the support member 1, and the plurality of second recesses 28 are formed in the conduction member 2. A method of forming the plurality of first recesses 18 and the plurality of second recesses 28 is not limited in any way, and examples thereof may include laser processing, etching processing, stamping processing, and the like. In the depicted example, the plurality of first recesses 18 and the plurality of second recesses 28, each of which extends along the x direction, are formed by laser processing.

For example, the first surface 1a of the die bonding portion 13 of the support member 1 is irradiated with a laser beam L and is sequentially scanned in the x direction. The laser beam L removes a portion of the surface layer 12 and reaches the base material 11. As a result, the plurality of first recesses 18 that penetrate the surface layer 12 and reach the base material 11 are formed.

Further, the second surface 2a of the wire bonding portion 23 of the conduction member 2 is irradiated with the laser beam L and is sequentially scanned in the x direction. The laser beam L removes a portion of the surface layer 22 and reaches the base material 21. As a result, the plurality of second recesses 28 that penetrate the surface layer 22 and reach the base material 21 are formed.

Figure 15:
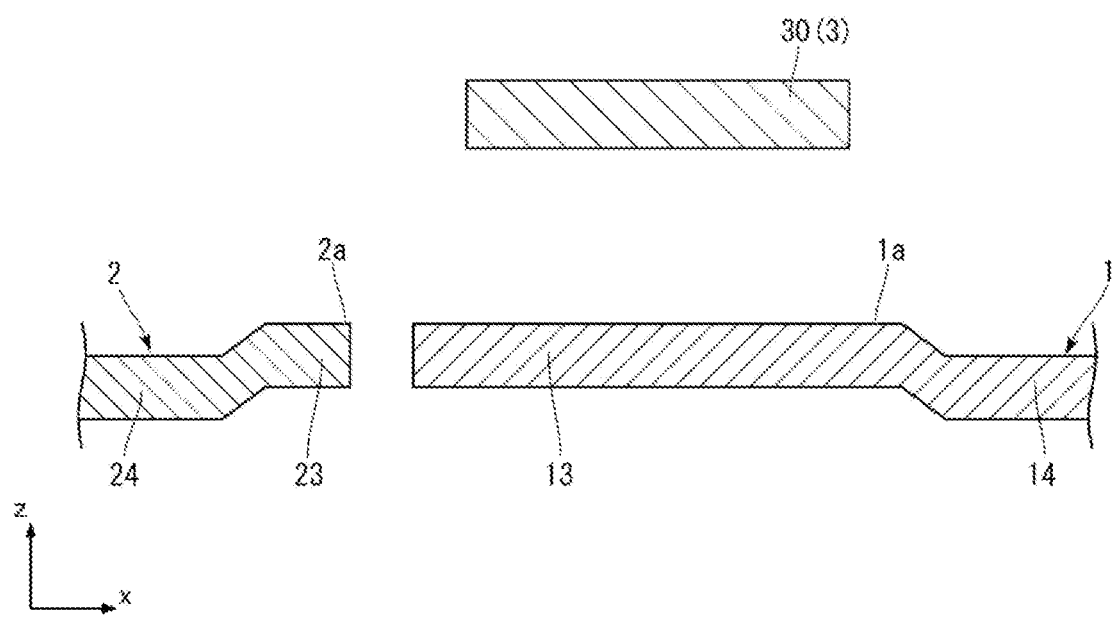
FIG. 15 is a cross-sectional view of the main part showing the method of manufacturing the semiconductor device according to the first embodiment of the present disclosure.
Figure 16:
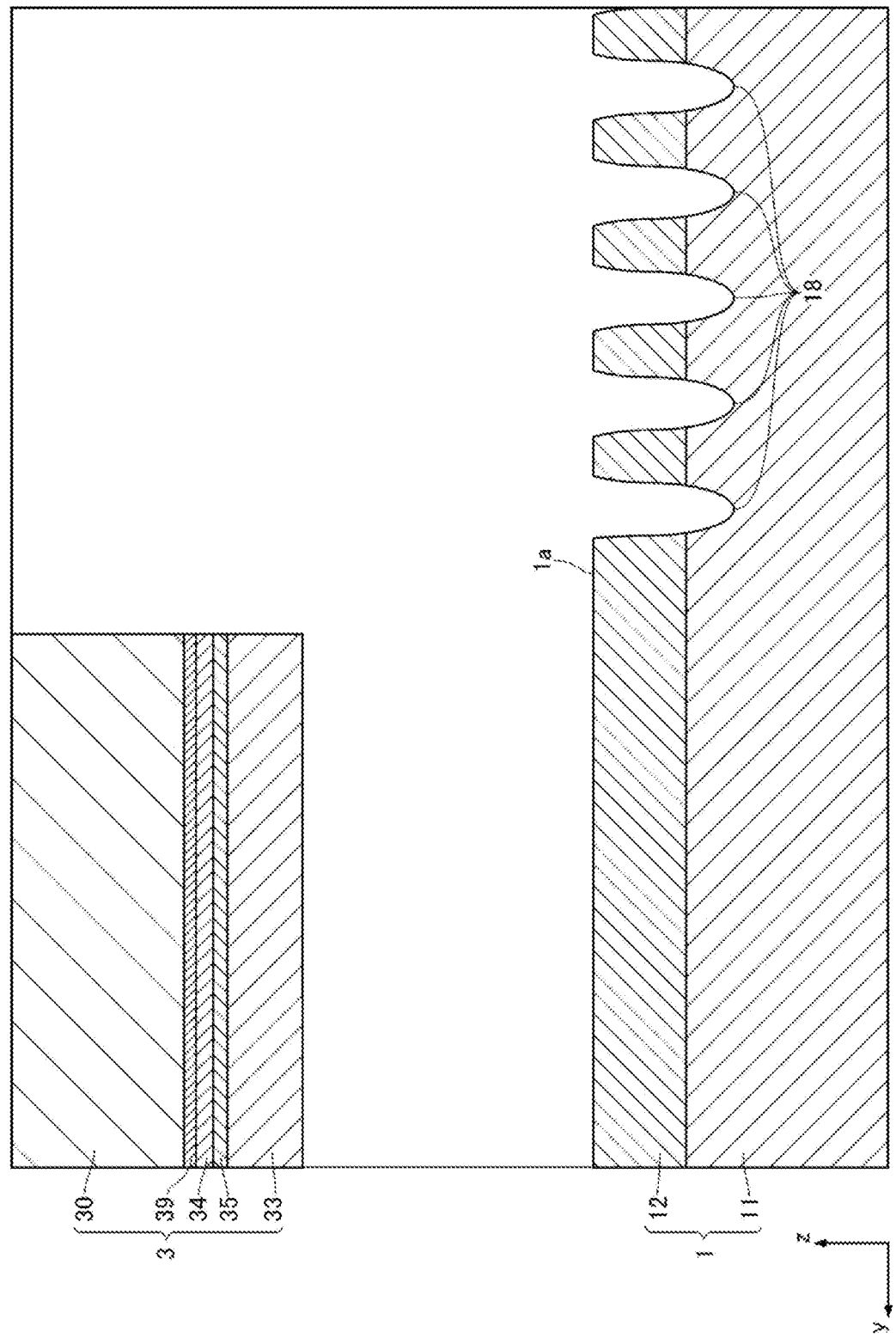
FIG. 16 is an enlarged cross-sectional view of the main part showing the method of manufacturing the semiconductor device according to the first embodiment of the present disclosure.

Next, as shown in FIGS. 15 and 16, the semiconductor element 3 is prepared. A step of preparing the support member 1 and a step of preparing the semiconductor element 3 are not limited in the sequence and may be performed at the same time.

As shown in FIG. 16, the semiconductor element 3 includes the semiconductor layer 30 and a third layer 33. The semiconductor layer 30 is a layer containing the semiconductor as described above. The third layer 33 is a layer containing the first metal and, in this example, contains Sn. The thickness of the third layer 33 is not limited in any way and is set to, for example, 1.5 µm or more and 4 µm or less, for example, about 2.5 µm.

Further, the semiconductor element 3 of this example includes a fourth layer 34, a fifth layer 35, and the base layer 39.

The fourth layer 34 is interposed between the semiconductor layer 30 and the third layer 33. The fourth layer 34 is a layer that becomes the first layer 31 in the semiconductor element 3 of the above-described semiconductor device A1. The fourth layer 34 contains the third metal. Examples of the third metal may include Ag, Au, Cu, Pt, Pd, Ni, Co, Fe, Mn, V, Ti, Ce, Dy, Y, Yb, Hf, and Mg. In this example, the third metal is Ni. The thickness of the fourth layer 34 is, for example, 0.1 μm or more and 0.5 μm or less and is set to, for example, about 0.3 μm.

The fifth layer 35 is interposed between the fourth layer 34 and the third layer 33. The fifth layer 35 is a layer containing the same first metal as the surface layer 12 and in this example, contains Ag. The thickness of the fifth layer 35 is, for example, 0.5 μm or more and 2.0 μm or less and is set to, for example, about 1.0 μm.

The base layer 39 is interposed between the semiconductor layer 30 and the fourth layer 34, and is in direct contact with the semiconductor layer 30. As described above, the base layer 39 contains, for example, Ti. The thickness of the base layer 39 is, for example, 0.05 μm or more and 0.2 μm or less and is set to, for example, about 0.1 μm.

Next, a step of forming the bonding layer 4 is performed. As shown in FIG. 10, in the present embodiment, the step of forming the bonding layer 4 includes a process of heating the support member 1 and a process of bringing the third layer 33 into contact with the surface layer 12.

In the process of heating the support member 1, the support member 1 is heated to or above a temperature at which the first metal contained in the third layer 33 and the second metal contained in the surface layer 12 can be alloyed by contacting each other.

Figure 17:
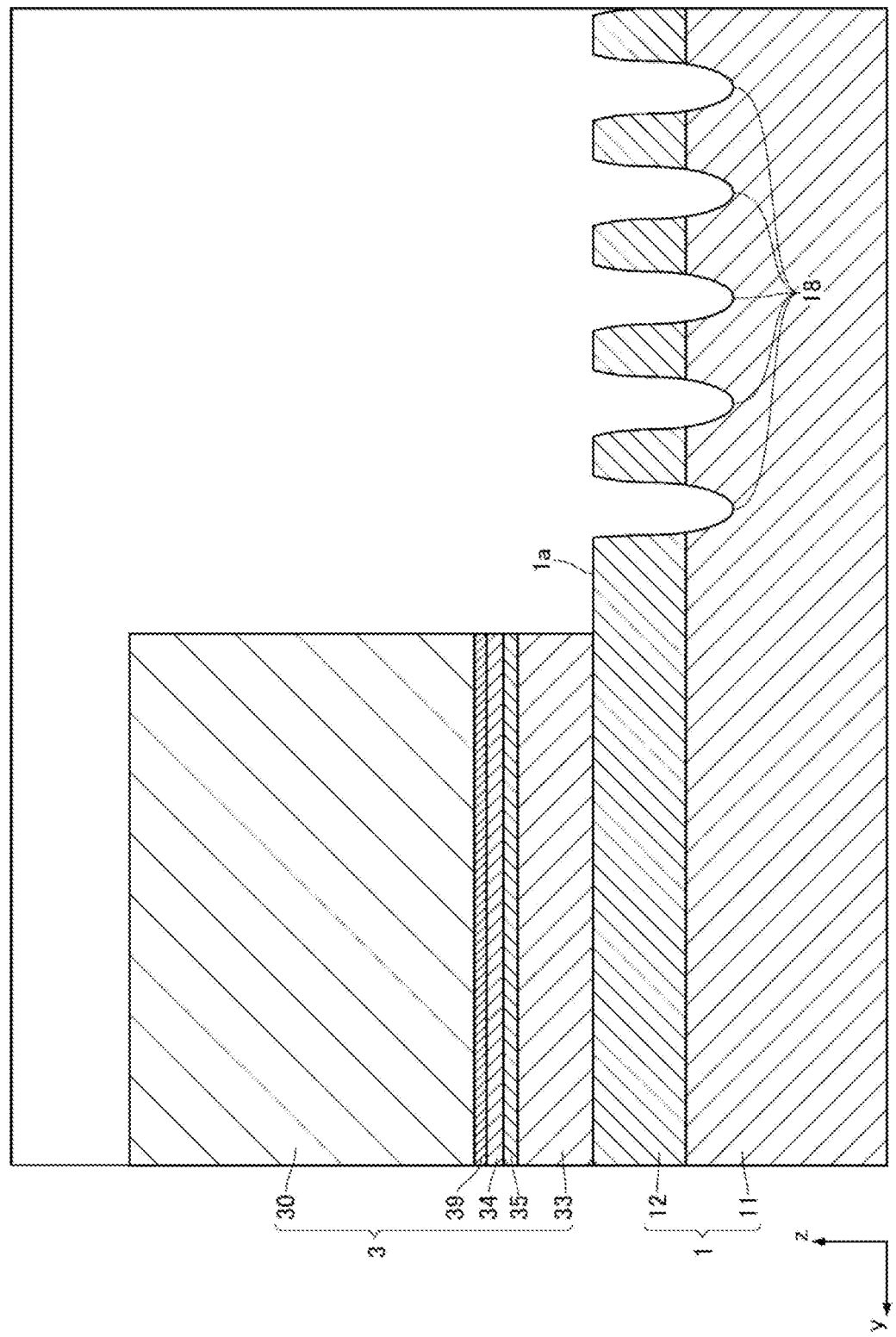
FIG. 17 is an enlarged cross-sectional view of the main part showing the method of manufacturing the semiconductor device according to the first embodiment of the present disclosure.

Next, as shown in FIG. 17, the process of bringing the third layer 33 into contact with the surface layer 12 is performed. As a result, the surface layer 12, which is a portion of the heated support member 1, comes into contact with the third layer 33. By this contact, heat is transferred from the preheated support member 1 to the semiconductor element 3 including the third layer 33, so that the semiconductor element 3 is heated. As a result, Sn as the first metal of the third layer 33 and Ag as the second metal of the surface layer 12 are alloyed to generate $Ag_3Sn$ which is an alloy of Sn and Ag, thereby forming the bonding layer 4 containing $Ag_3Sn$.

In the formation of the bonding layer 4, Sn contained in the third layer 33 may diffuse to a portion that was the surface layer 12. When Sn is diffused in the z direction, the bonding layer 4 includes a portion located on the base material 11 side in the z direction with respect to the first surface 1a. Further, when Sn is diffused in a direction orthogonal to the z direction, the bonding layer 4 includes a portion protruding from the semiconductor element 3 when viewed along the z direction.

Figure 18:
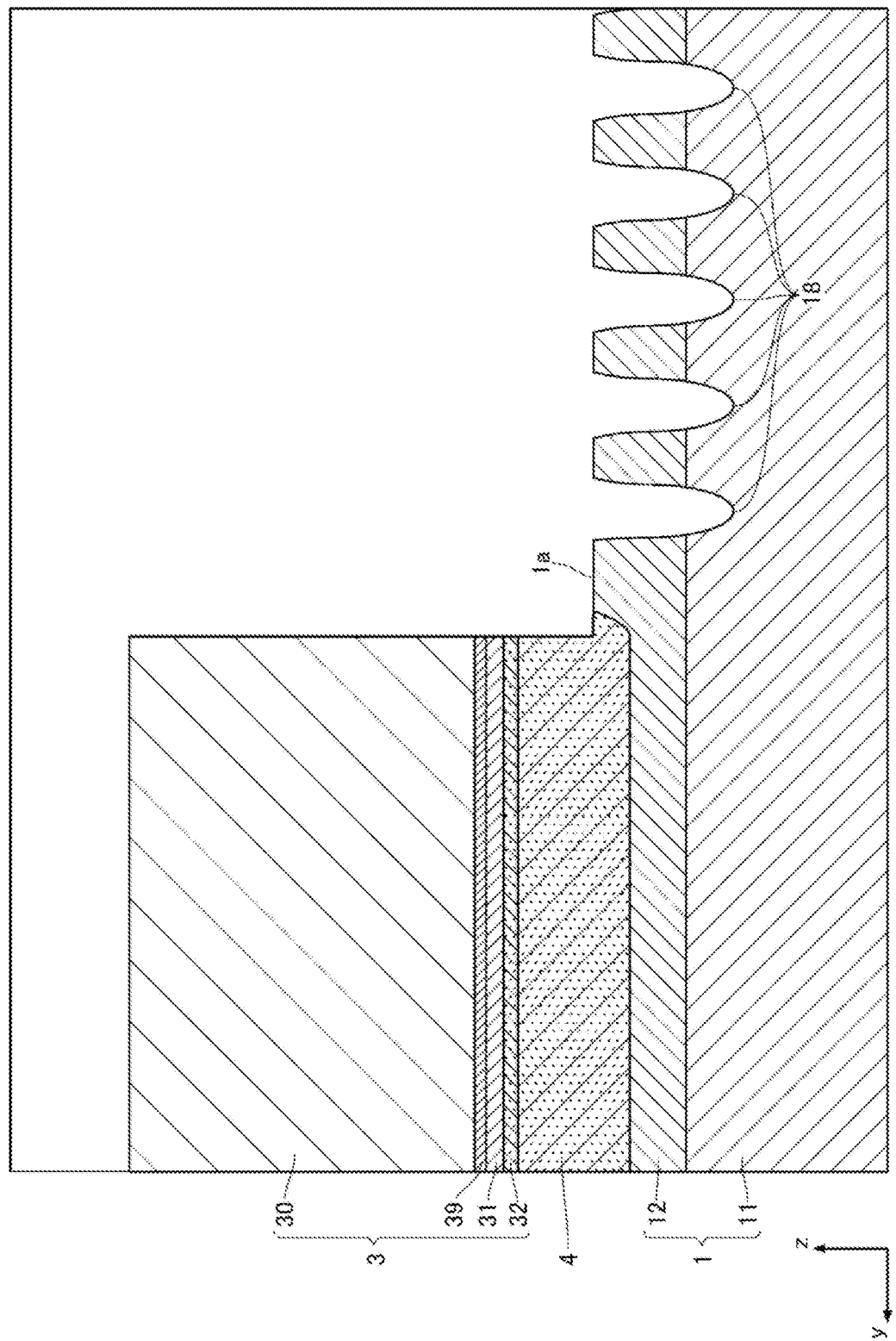
FIG. 18 is an enlarged cross-sectional view of the main part showing the method of manufacturing the semiconductor device according to the first embodiment of the present disclosure.

In the present embodiment, in the corresponding step, the fifth layer 35 containing the second metal shown in FIG. 17 is heated to alloy with the third layer 33, thereby forming a portion of the bonding layer 4 shown in FIG. 18. In this example, the entire fifth layer 35 diffuses into the third layer 33 to form the portion of the bonding layer 4. Further, Ni as the third metal contained in the fourth layer 34 shown in FIG. 17 and Sn as the first metal contained in the third layer 33 are alloyed to form the second layer 32 shown in FIG. 18. In this example, the second layer 32 contains a Sn—Ni alloy which is an alloy of Sn and Ni.

Figure 19:
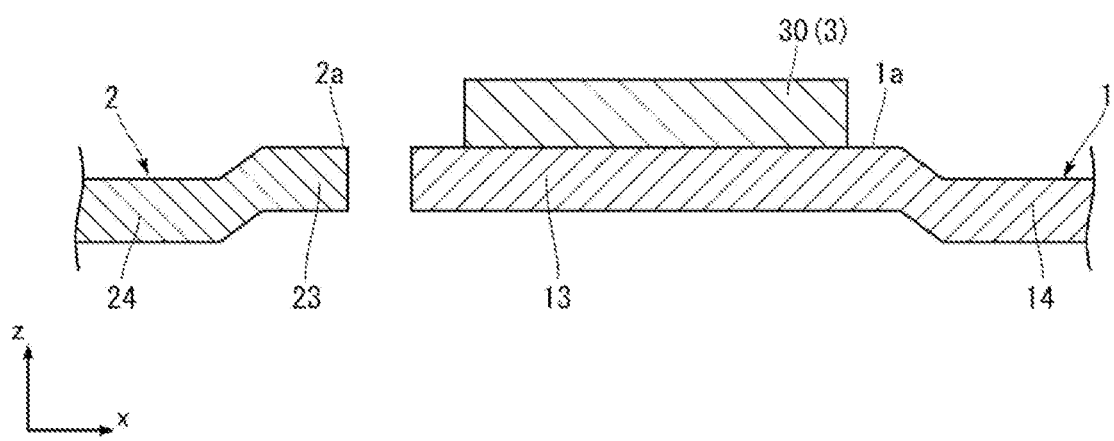
FIG. 19 is a cross-sectional view of the main part showing the method of manufacturing the semiconductor device according to the first embodiment of the present disclosure.

By going through the step of forming the bonding layer 4 as described above, the semiconductor element 3 is bonded to the support member 1 as shown in FIGS. 18 and 19.

Unlike the present embodiment, the bonding layer 4 may be formed by performing the process of bringing the third layer 33 into contact with the surface layer 12 and then performing a process of heating the support member 1 and the semiconductor element 3.

After that, the above-described semiconductor device A1 can be obtained by appropriately performing a step of bonding the wire 5 to the conduction member 2 and the semiconductor element 3 and a step of forming the sealing resin 6.

Next, the operations of the semiconductor device A1 and the method of manufacturing the semiconductor device A1 will be described.

According to the present embodiment, as shown in FIGS. 7 and 8, the bonding layer 4 contains an alloy of the first metal and the second metal. This makes it possible to increase the melting point of the bonding layer 4. As a result, for example, in a mounting process of mounting the semiconductor device on a circuit board or the like, the melting point of the bonding layer 4 can be raised to be higher than a temperature at which the semiconductor device A1 is exposed. Therefore, it is possible to suppress defects such as cracks and peeling in the bonding between the support member 1 and the semiconductor element 3.

Sn is selected as the first metal, and Ag is selected as the second metal. As a result, the bonding layer 4 contains $Ag_3Sn$. The melting point of $Ag_3Sn$ is 480 degrees C. For example, even if the semiconductor device A1 is exposed to a temperature of about 400 degrees C. in the mounting process of the semiconductor device A1, it is possible to suppress defects such as cracks and peeling from occurring in the bonding layer 4. It is preferable that the composition ratio of Ag in the bonding layer 4 is 73 mass % or more to ensure that $Ag_3Sn$ is present in the bonding layer 4. In addition, Ag has a high degree of diffusion into Sn. As a result, Ag can be diffused over the entire Sn, and it is possible to reduce a portion where Sn remains as elemental metal. This is preferable for suppressing the occurrence of bonding defects due to Sn which has a low melting point.

In the manufacture of the semiconductor device A1, as shown in FIG. 17, the bonding layer 4 is formed by contacting and heating the third layer 33 containing Sn as the first metal and the surface layer 12 containing Ag as the second metal. This bonding method does not require a process such as pressurization at a high pressure, and completes alloying promptly upon contact. Therefore, the manufacturing efficiency of the semiconductor device A1 can be improved. Further, the bonding layer 4 formed by such a step can be made significantly thinner than, for example, the thickness of solder in a configuration bonded by the solder. Therefore, it is possible to obtain low resistance and high thermal conductivity between the support member 1 and the semiconductor element 3. As shown in FIG. 10, the step of forming the bonding layer 4 can be further shortened by performing the process of heating the support member 1 in advance and then performing the process of bringing the third layer 33 into contact with the surface layer 12.

In the step of forming the bonding layer 4, as shown in FIG. 17, the third layer 33 is sandwiched between the surface layer 12 and the fifth layer 35. The third layer 33 contains Sn as the first metal, and the surface layer 12 and the fifth layer 35 contain Ag as the second metal. This makes it possible to diffuse Ag from both sides of the third layer 33 in the z direction. Therefore, it is preferable to increase the occupancy rate of $Ag_3Sn$ in the bonding layer 4 and reduce a portion where Sn remains as elementary metal.

As shown in FIG. 8, the semiconductor element 3 of the semiconductor device A1 includes the first layer 31. The first layer 31 contains Ni as the third metal. Further, by including the first layer 31, the semiconductor element 3 includes the second layer 32. The second layer 32 contains an alloy of the first metal and the third metal. In this example, the second layer 32 contains a Sn—Ni alloy. With such a configuration, in the step of forming the bonding layer 4, it is possible to prevent the second metal such as Ag contained in the third layer 33 for forming the bonding layer 4 from diffusing into the semiconductor layer 30. It is preferable to provide the base layer 39 to prevent the second metal from diffusing into the semiconductor layer 30.

The plurality of first recesses 18 are formed in the support member 1. The plurality of first recesses 18 are buried with the sealing resin 6. As a result, for example, when the semiconductor device A1 is heated during mounting or use of the semiconductor device A1 and the support member 1 exhibits a behavior of expanding with respect to the semiconductor element 3, the sealing resin 6 functions to suppress the expansion of the support member 1. This makes it possible to reduce a thermal stress generated in the bonding layer 4 sandwiched between the support member 1 and the semiconductor element 3. In particular, when the bonding layer 4 is formed by a process of alloying the first metal and the second metal, the thickness of the bonding layer 4 is thinner than, for example, the thickness of solder. The thinner the bonding layer 4, the higher the thermal stress can be. In the present embodiment, by providing the plurality of first recesses 18, it is possible to suppress the thermal stress and suppress the bonding defects in the semiconductor device A1 in which the thin bonding layer 4 is adopted.

The first recesses 18 penetrate the surface layer 12 and reach the base material 11. When the bonding strength between the sealing resin 6 and the surface layer 12 is weaker than the bonding strength between the sealing resin 6 and the base material 11, the bonding strength between the sealing resin 6 and the support member 1 (the plurality of first recesses 18) can be increased.

The plurality of second recesses 28 are formed in the conduction member 2. The plurality of second recesses 28 are buried with the sealing resin 6. As a result, the bonding strength between the conduction member 2 (the plurality of second recesses 28) and the sealing resin 6 can be increased.

The second recesses 28 penetrate the surface layer 22 and reach the base material 21. When the bonding strength between the sealing resin 6 and the surface layer 22 is weaker than the bonding strength between the sealing resin 6 and the base material 21, the bonding strength between the sealing resin 6 and the conduction member 2 (the plurality of second recesses 28) can be increased.

FIGS. 20 to 25 show modifications and other embodiments of the present disclosure. In these figures, the same or similar elements as those in the above embodiment are denoted by the same reference numerals as those in the above embodiment.

First Modification of First Embodiment

Figure 20:
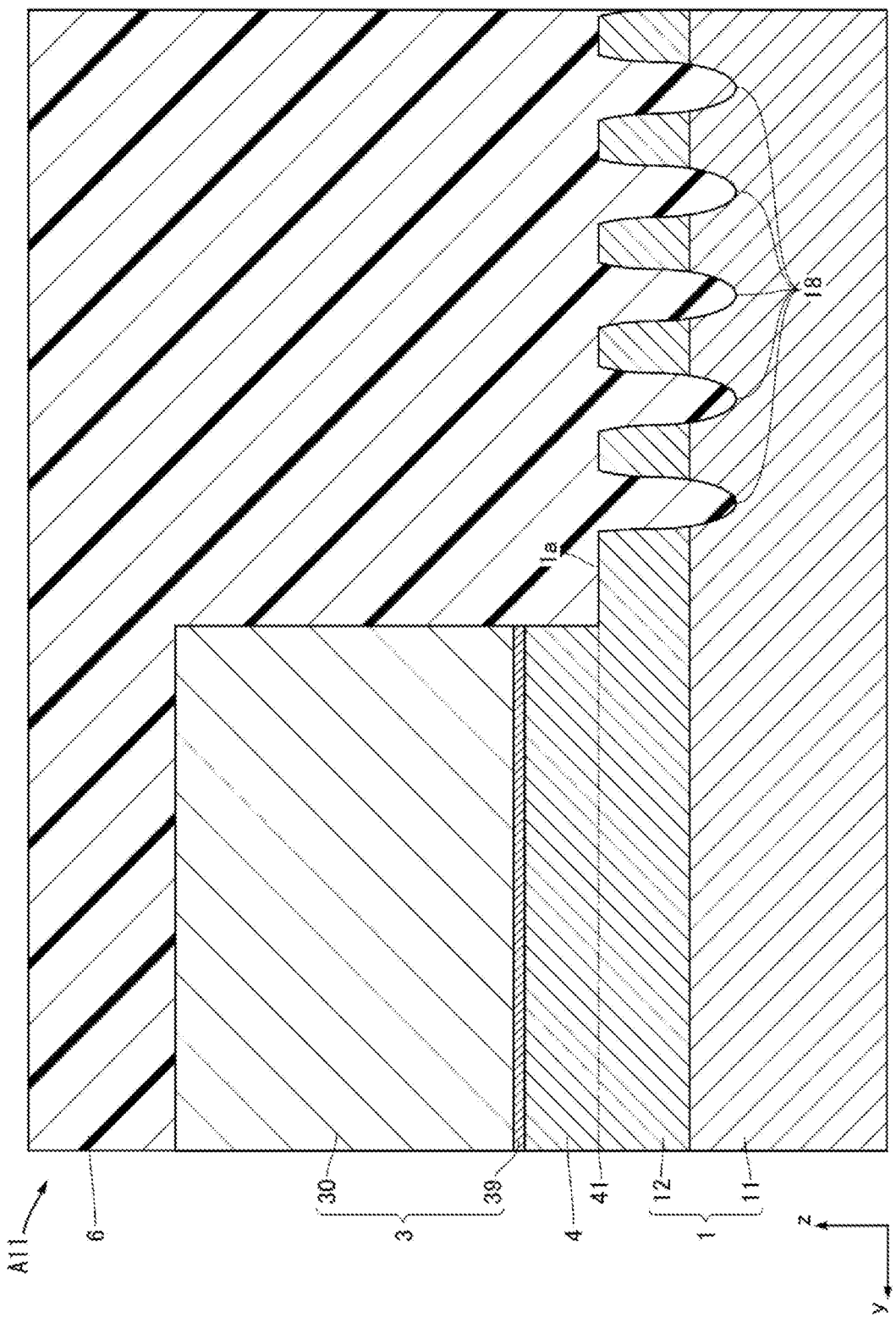
FIG. 20 is an enlarged cross-sectional view of a main part showing a first modification of the semiconductor device according to the first embodiment of the present disclosure.

FIG. 20 shows a first modification of the semiconductor device A1. In a semiconductor device A11 of this modification, the bonding layer 4 is formed by solid phase diffusion bonding.

The bonding layer 4 is a layer that is solid phase diffusion-bonded by being set to the conditions such as a predetermined temperature, pressure, and the like in a state where two layers are in contact with each other. The bonding layer 4 includes a bonding interface 41. The bonding interface 41 is a surface on which the boundary between the two layers bonded by solid phase diffusion exists. When an ideal solid phase diffusion bonding is made, the bonding interface 41 can be in a form that does not appear clearly or can hardly be confirmed.

The bonding layer 4 in the above-described semiconductor device A1 is a layer formed by an alloying process. In this way, the bonding layer 4 in the present disclosure is a layer integrated without going through a molten state. When the bonding layer 4 is formed by solid phase diffusion bonding, the first metal and the second metal are the same metal. In this modification, Ag is selected as the first metal and the second metal for the bonding layer 4.

Figure 21:
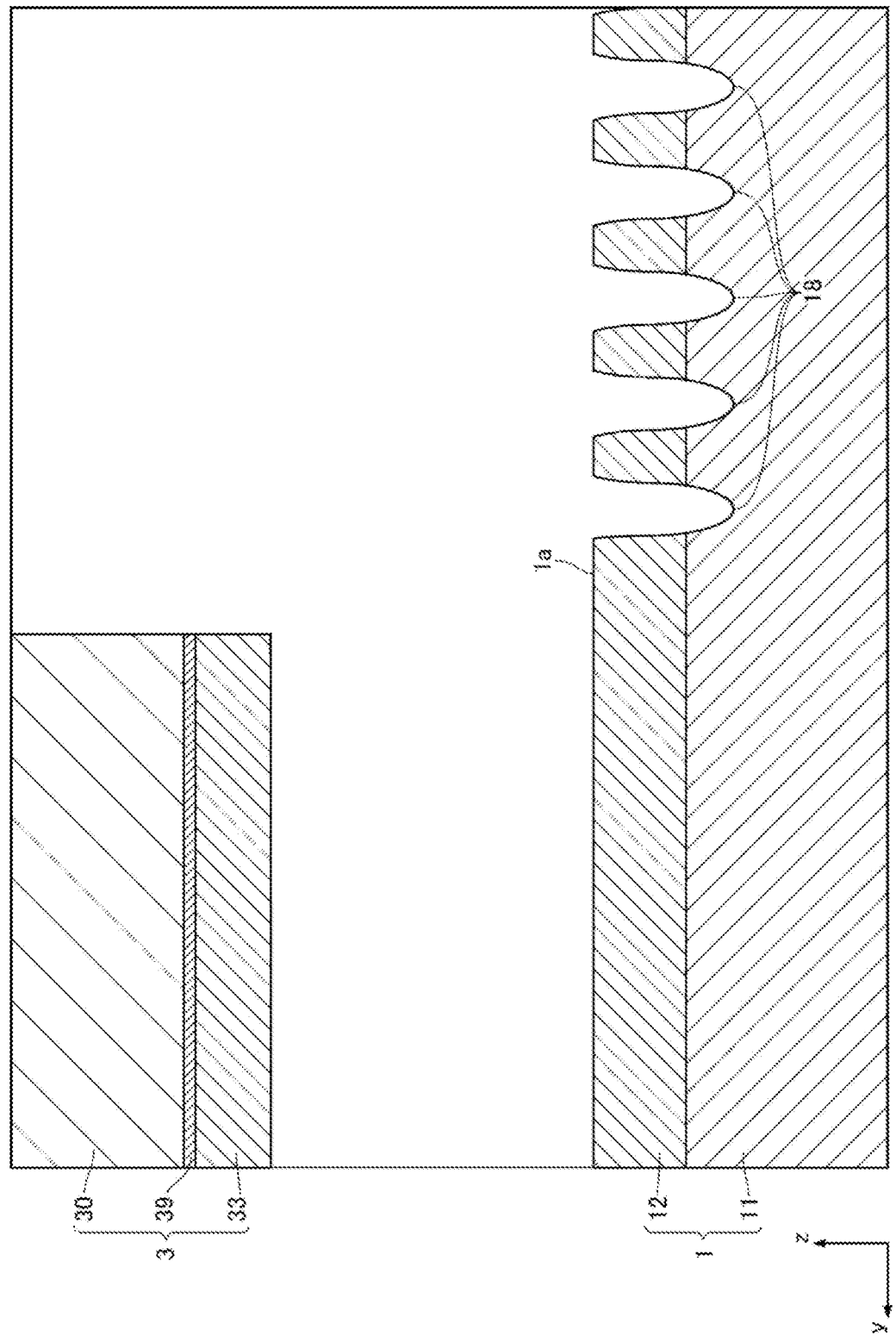
FIG. 21 is an enlarged cross-sectional view of the main part showing a method of manufacturing the first modification of the semiconductor device according to the first embodiment of the present disclosure.

FIG. 21 shows an example of a method of manufacturing the semiconductor device A11. The semiconductor element 3 includes the semiconductor layer 30, the base layer 39, and the third layer 33. The third layer 33 contains Ag as the first metal. The support member 1 includes the base material 11 and the surface layer 12. The surface layer 12 contains Ag as the second metal. When the third layer 33 and the surface layer 12, both of which are configured to contain the same type of metal, are brought into contact with each other under the conditions such as predetermined temperature, pressure, and the like, they are solid phase diffusion-bonded to each other to form the bonding layer 4.

Even with this modification, it is possible to suppress defects such as cracks and peeling in the bonding between the support member 1 and the semiconductor element 3. Further, as can be understood from this modification, the specific configuration of the bonding layer 4 is not limited in any way, and the bonding layer 4 may be a layer in which the first metal and the second metal are integrated without going through a molten state.

Second Embodiment

Figure 22:
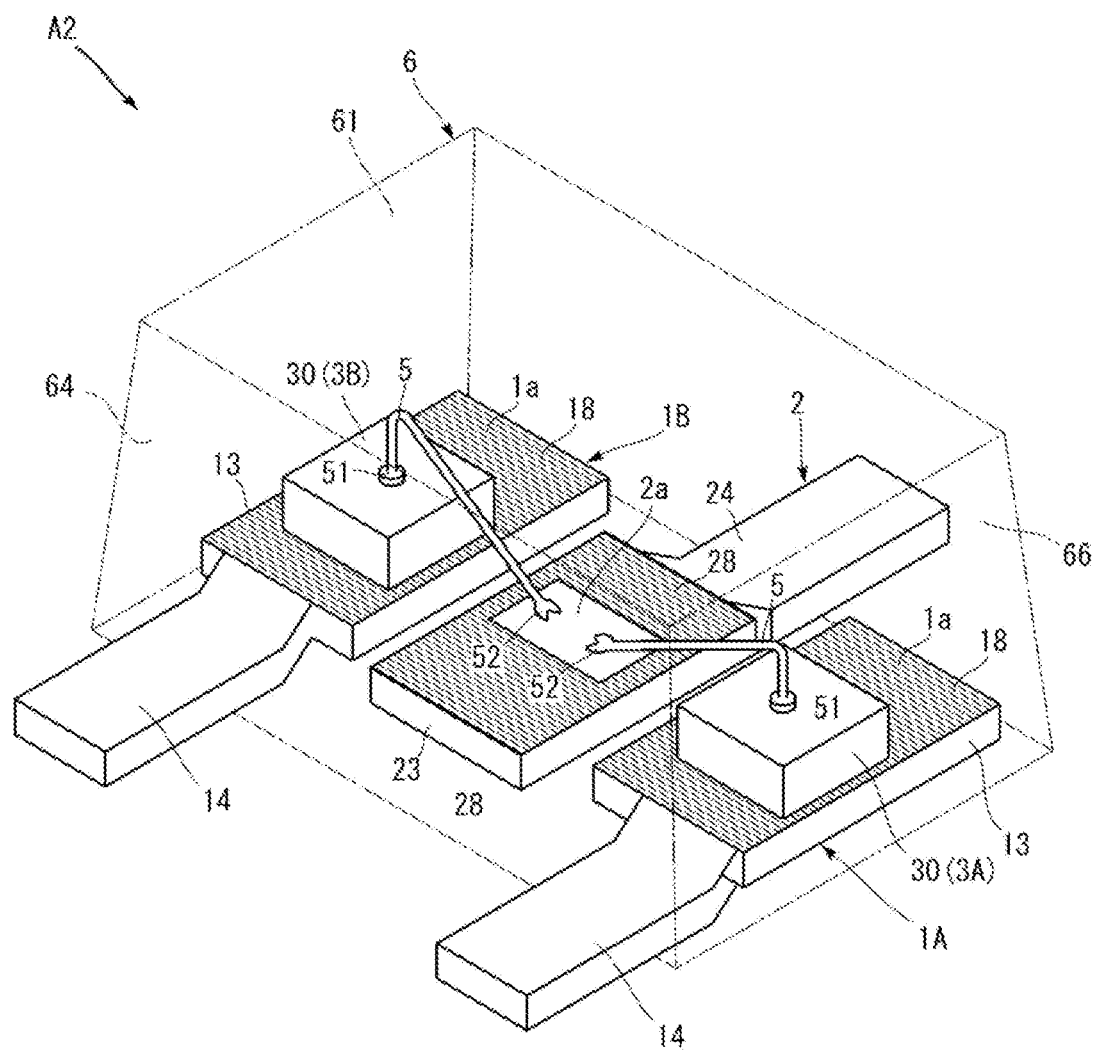
FIG. 22 is a perspective view showing a semiconductor device according to a second embodiment of the present disclosure.

FIG. 22 is a perspective view showing a semiconductor device according to a second embodiment of the present disclosure. The semiconductor device A2 of the present embodiment includes a support member 1A, a support member 1B, a conduction member 2, a semiconductor element 3A, a semiconductor element 3B, a plurality of bonding layers 4 (not shown), a plurality of wires 5, and a sealing resin 6.

The support member 1A includes the same constituent requirements as the above-described support member 1 and includes a die bonding portion 13 and an extension portion 14. Further, the support member 1A includes a base material 11 and a surface layer 12. The surface layer 12 is provided on the die bonding portion 13. A plurality of first recesses 18 are formed in the support member 1A. The semiconductor element 3A is bonded to the die bonding portion 13 of the support member 1A via the bonding layer 4. The configuration of the above-described first embodiment and its modification is appropriately applied for the configuration related to the bonding layer 4.

The support member 1B includes the same constituent requirements as the above-described support member 1 and includes a die bonding portion 13 and an extension portion 14. Further, the support member 1B includes a base material 11 and a surface layer 12. The surface layer 12 is provided on the die bonding portion 13. A plurality of first recesses 18 are formed in the support member 1B. The semiconductor element 3B is bonded to the die bonding portion 13 of the support member 1B via the bonding layer 4. The configuration of the above-described first embodiment and its modification is appropriately applied for the configuration related to the bonding layer 4.

The conduction member 2 is arranged between the support member 1A and the support member 1B. The conduction member 2 includes the same constituent requirements as the above-described conduction member 2 and includes a wire bonding portion 23 and an extension portion 24. Further, the conduction member 2 includes a base material 21 and a surface layer 22. The surface layer 22 is provided on the wire bonding portion 23. A plurality of second recesses 28 are formed in the conduction member 2.

The semiconductor element 3A and the semiconductor element 3B are, for example, all diodes. An electrode (not shown) of each of the semiconductor element 3A and the semiconductor element 3B and the wire bonding portion 23 of the conduction member 2 are electrically connected to each other by the plurality of wires 5.

Also in this embodiment, it is possible to suppress defects such as cracks and peeling in the boding between the support member 1A and the support member 1B on one hand and the semiconductor element 3A and the semiconductor element 3B on the other hand. Further, as can be understood from this embodiment, the number of support members, the number of semiconductor elements, the arrangement thereof, and the like included in the semiconductor device according to the present disclosure are not limited in any way.

First Modification of Second Embodiment

Figure 23:
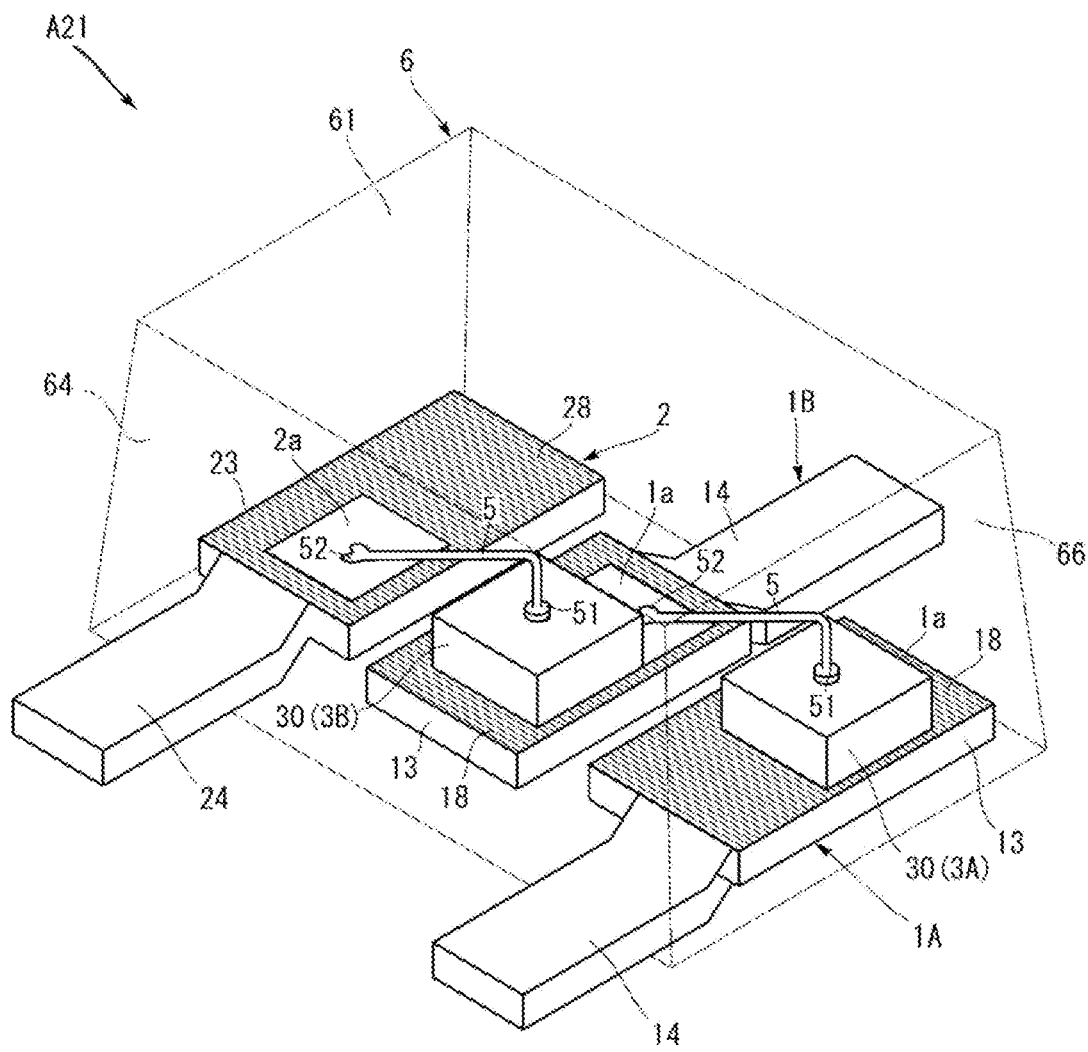
FIG. 23 is a perspective view showing a first modification of the semiconductor device according to the second embodiment of the present disclosure.

FIG. 23 is a perspective view showing a first modification of the semiconductor device A2 of the present disclosure. In a semiconductor device A21 of this modification, the support member 1A and the support member 1B are adjacent to each other. The conduction member 2 is arranged on the side opposite to the support member 1A with the support member 1B interposed therebetween. The semiconductor element 3A and the support member 1B are connected by the wire 5. The semiconductor element 3B and the conduction member 2 are connected by the wire 5. The bonding between the semiconductor element 3A and the support member 1A and the bonding between the semiconductor element 3B and the support member 1B are the same as those of the above-described semiconductor device A2.

Even with this modification, it is possible to suppress defects such as cracks and peeling in the bonding between the support member 1A and the support member 1B on one hand and the semiconductor element 3A and the semiconductor element 3B on the other hand. Further, as can be understood from this modification, the number of support members, the number of semiconductor elements, the arrangement thereof, and the like included in the semiconductor device according to the present disclosure are not limited in any way.

Second Modification of Second Embodiment

Figure 24:
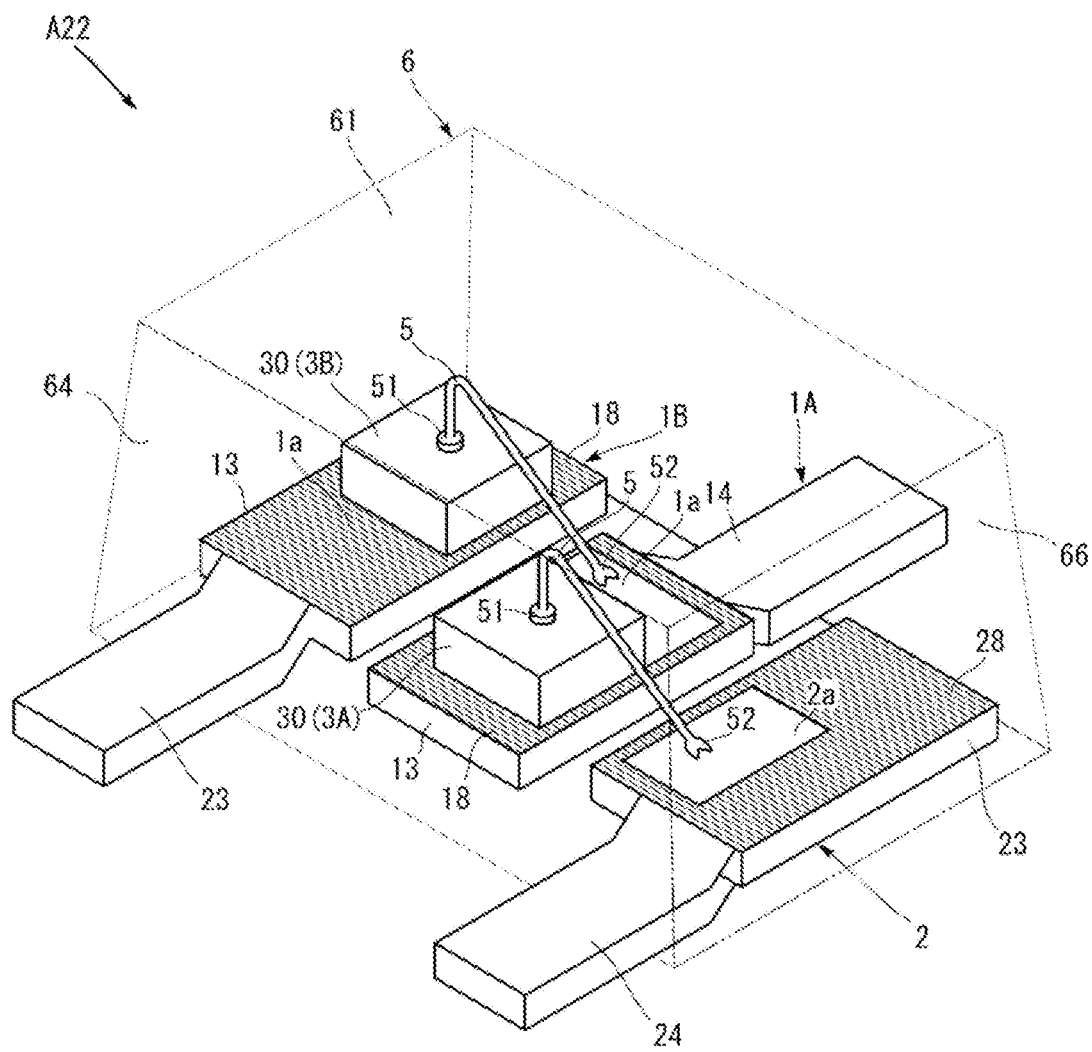
FIG. 24 is a perspective view showing a second modification of the semiconductor device according to the second embodiment of the present disclosure.

FIG. 24 is a perspective view showing a third modification of the semiconductor device A2 of the present disclosure. A semiconductor device A22 of this modification has a similar configuration as that of the above-described semiconductor device A21 except for the arrangement of the support member 1A, the support member 1B, and the conduction member 2. In this modification, the support member 1A and the support member 1B are adjacent to each other, and the conduction member 2 is arranged on the side opposite to the support member 1B with the support member 1A interposed therebetween. The semiconductor element 3B and the support member 1A are connected by the wire 5. The semiconductor element 3A and the conduction member 2 are connected by the wire 5. The bonding between the semiconductor element 3A and the support member 1A and the bonding between the semiconductor element 3B and the support member 1B are the same as those of the above-described semiconductor device A2.

Even with this modification, it is possible to suppress defects such as cracks and peeling in the bonding between the support member 1A and the support member 1B on one hand and the semiconductor element 3A and the semiconductor element 3B on the other hand. Further, as can be understood from this modification, the number of support members, the number of semiconductor elements, the arrangement thereof, and the like included in the semiconductor device according to the present disclosure are not limited in any way.

Third Modification of Second Embodiment

Figure 25:
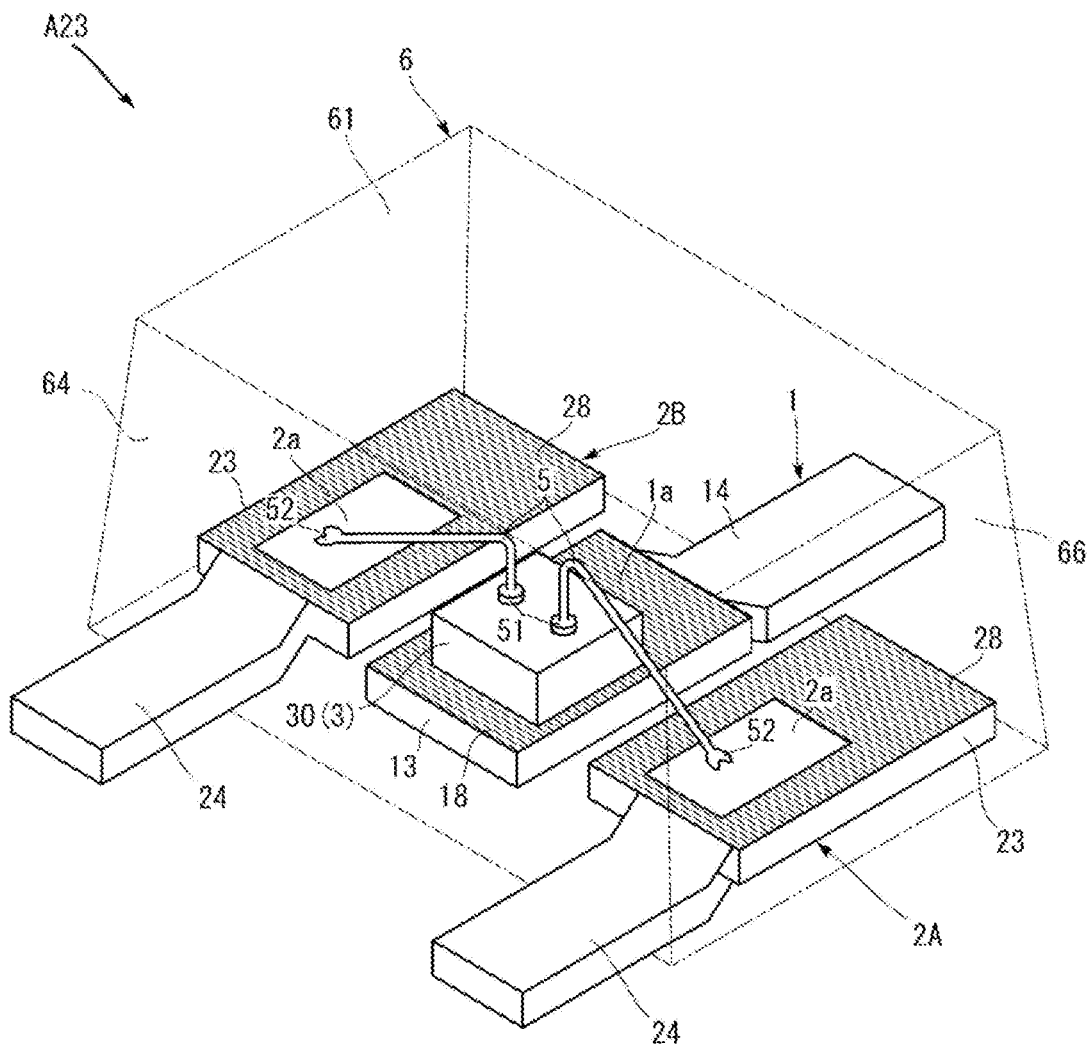
FIG. 25 is a perspective view showing a third modification of the semiconductor device according to the second embodiment of the present disclosure.

FIG. 25 is a perspective view showing a third modification of the semiconductor device A2 of the present disclosure. A semiconductor device A23 of this modification includes the support member 1, a conduction member 2A, a conduction member 2B, the semiconductor element 3, the bonding layer 4 (not shown), the plurality of wires 5, and the sealing resin 6.

The conduction member 2A and the conduction member 2B are arranged to sandwich the support member 1. The semiconductor element 3 is bonded to the die bonding portion 13 of the support member 1 via the bonding layer 4 (not shown). The semiconductor element 3 of this modification is, for example, a transistor. A gate electrode and a source electrode (both not shown) are formed on the upper surface of the semiconductor element 3 in the figure, and a drain electrode is formed on the lower surface of the semiconductor element 3 in the figure. One of the gate electrode and the source electrode and the wire bonding portion 23 of the conduction member 2A are connected by the wire 5, and the other of the gate electrode and the source electrode and the wire bonding portion 23 of the conduction member 2B are connected by the wire 5.

Even with this modification, it is possible to suppress defects such as cracks and peeling in the bonding between the support member 1 and the semiconductor element 3. Further, as can be understood from this modification, the type of the semiconductor element included in the semiconductor device according to the present disclosure are not limited in any way.

The semiconductor device and the method of manufacturing the semiconductor device according to the present disclosure are not limited to the above-described embodiments. The specific configuration of the semiconductor device and the method of manufacturing the semiconductor device according to the present disclosure can be freely changed in various ways in design.

The semiconductor device according to the present disclosure is not limited to the above-described embodiments. The semiconductor device and the specific configuration of the semiconductor device according to the present disclosure can be freely changed in various ways in design.

[Supplementary Note 1]

A semiconductor device including:
a semiconductor element;
a support member;
a bonding layer interposed between the semiconductor element and the support member;

and
a sealing resin that covers the semiconductor element and at least a portion of the support member,
wherein the bonding layer is a layer in which a layer containing first metal and a layer containing second metal are integrated without going through a molten state, and
wherein the support member includes a first surface facing in a thickness direction and facing a side on which the semiconductor element is located, and a plurality of first recesses located outside the bonding layer and recessed from the first surface when viewed along the thickness direction.

[Supplementary Note 2]
The semiconductor device of Supplementary Note 1, wherein the plurality of first recesses are formed at positions avoiding the semiconductor element when viewed along the thickness direction.

[Supplementary Note 3]
The semiconductor device of Supplementary Note 2, wherein the plurality of first recesses are formed in an annular region surrounding the semiconductor element when viewed along the thickness direction.

[Supplementary Note 4]
The semiconductor device of any one of Supplementary Notes 1 to 3, wherein the bonding layer contains an alloy of the first metal and the second metal.

[Supplementary Note 5]
The semiconductor device of Supplementary Note 4, wherein the first metal is Sn, and the second metal is Ag.

[Supplementary Note 6]
The semiconductor device of Supplementary Note 5, wherein the bonding layer contains $Ag_3Sn$.

[Supplementary Note 7]
The semiconductor device of Supplementary Note 6, wherein the bonding layer has a composition ratio of Ag of 73 mass % or more.

[Supplementary Note 8]
The semiconductor device of any one of Supplementary Notes 5 to 7, further including: a first layer that is interposed between the bonding layer and the semiconductor element and contains third metal.

[Supplementary Note 9]
The semiconductor device of Supplementary Note 8, further including: a second layer that is interposed between the bonding layer and the first layer and contains an alloy of the first metal and the third metal.

[Supplementary Note 10]
The semiconductor device of Supplementary Note 9, wherein the bonding layer is thicker than the second layer.

[Supplementary Note 11]
The semiconductor device of any one of Supplementary Notes 5 to 10, wherein the support member includes a base material and a surface layer that is interposed between the base material and the bonding layer and constitutes the first surface.

[Supplementary Note 12]
The semiconductor device of Supplementary Note 11, wherein the surface layer is thinner than the base material.

[Supplementary Note 13]
The semiconductor device of Supplementary Note 11 or 12, wherein the surface layer contains Ag.

[Supplementary Note 14]
The semiconductor device of Supplementary Note 13, wherein the base material contains Cu.

[Supplementary Note 15]
The semiconductor device of any one of Supplementary Notes 11 to 14, wherein the first recesses penetrate the surface layer and reach the base material.

[Supplementary Note 16]
The semiconductor device of any one of Supplementary Notes 1 to 15, further including:
a conduction member located away from the support member; and
a wire connected to the semiconductor element and the conduction member,
wherein the conduction member includes a second surface to which the wire is bonded, and a plurality of second recesses recessed from the second surface, and
wherein the plurality of second recesses are formed at positions avoiding a bonding portion between the wire and the conduction member when viewed along the thickness direction.

[Supplementary Note 17]
The semiconductor device of Supplementary Note 16, wherein a depth of the second recesses is deeper than a depth of the first recesses.

According to the present disclosure, it is possible to suppress defects in bonding between a lead and a semiconductor element.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device comprising:
a semiconductor element;
a support member;
a bonding layer interposed between the semiconductor element and the support member;
a sealing resin that covers the semiconductor element and at least a portion of the support member,
a first layer that is interposed between the bonding layer and the semiconductor element and contains third metal; and
a second layer that is interposed between the bonding layer and the first layer and contains an alloy of the first metal and the third metal,
wherein the bonding layer is a layer in which a layer containing first metal and a layer containing second metal are integrated without going through a molten state, and
wherein the support member includes a first surface facing in a thickness direction and facing a side on which the semiconductor element is located, and a plurality of first recesses located outside the bonding layer and recessed from the first surface when viewed along the thickness direction,
wherein the bonding layer contains an alloy of the first metal and the second metal,
wherein the first metal is Sn, and the second metal is Ag,
wherein the bonding layer contains $Ag_3Sn$,
wherein a thickness of the bonding layer is 2 µm or more and 5 µm or less, and wherein the support member includes a base material and a surface layer that is interposed between the base material and the bonding layer and constitutes the first surface.

2. The semiconductor device of claim 1, wherein the plurality of first recesses are formed at positions avoiding the semiconductor element when viewed along the thickness direction.

3. The semiconductor device of claim 2, wherein the plurality of first recesses are formed in an annular region surrounding the semiconductor element when viewed along the thickness direction.

4. The semiconductor device of claim 1, wherein the bonding layer has a composition ratio of Ag of 73 mass % or more.

5. The semiconductor device of claim 1, wherein the bonding layer is thicker than the second layer.

6. The semiconductor device of claim 1, wherein the surface layer is thinner than the base material.

7. The semiconductor device of claim 1, wherein the surface layer contains Ag.

8. The semiconductor device of claim 7, wherein the base material contains Cu.

9. The semiconductor device of claim 1, wherein the first recesses penetrate the surface layer and reach the base material.

10. The semiconductor device of claim 1, further comprising:
- a conduction member located away from the support member; and
- a wire connected to the semiconductor element and the conduction member,
    - wherein the conduction member includes a second surface to which the wire is bonded, and a plurality of second recesses recessed from the second surface, and
    - wherein the plurality of second recesses are formed at positions avoiding a bonding portion between the wire and the conduction member when viewed along the thickness direction.

11. The semiconductor device of claim 10, wherein a depth of the second recesses is deeper than a depth of the first recesses.

* * * * *